United States Patent
Chau et al.

(10) Patent No.: US 12,072,689 B2
(45) Date of Patent: Aug. 27, 2024

(54) MODEL-BASED SCHEDULING FOR SUBSTRATE PROCESSING SYSTEMS

(71) Applicant: LAM RESEARCH CORPORATION, Fremont, CA (US)

(72) Inventors: Raymond Chau, San Ramon, CA (US); Chung-Ho Huang, San Jose, CA (US); Henry Chan, Morgan Hill, CA (US); Vincent Wong, Fremont, CA (US); Yu Ding, Los Altos, CA (US); Ngoc-Diep Nguyen, Portland, OR (US); Gerramine Manuguid, Lake Oswego, OR (US)

(73) Assignee: LAM RESEARCH CORPORATION, Fremont, CA (US)

(*) Notice: Subject to any disclaimer, the term of this patent is extended or adjusted under 35 U.S.C. 154(b) by 373 days.

(21) Appl. No.: 17/442,517

(22) PCT Filed: Mar. 24, 2020

(86) PCT No.: PCT/US2020/024478
§ 371 (c)(1),
(2) Date: Sep. 23, 2021

(87) PCT Pub. No.: WO2020/205339
PCT Pub. Date: Oct. 8, 2020

(65) Prior Publication Data
US 2022/0171373 A1    Jun. 2, 2022

Related U.S. Application Data

(60) Provisional application No. 62/826,185, filed on Mar. 29, 2019.

(51) Int. Cl.
G05B 19/418    (2006.01)
C23C 14/54    (2006.01)
(Continued)

(52) U.S. Cl.
CPC ........ *G05B 19/41865* (2013.01); *C23C 14/54* (2013.01); *C23C 16/52* (2013.01);
(Continued)

(58) Field of Classification Search
CPC .... G05B 19/41865; G05B 2219/39001; G05B 2219/45031; C23C 14/54; C23C 16/52; H01J 2237/334
(Continued)

(56) References Cited

U.S. PATENT DOCUMENTS 6,373,033 B1    4/2002    de Waard et al.
2005/0187649 A1    8/2005    Funk et al.
(Continued)

FOREIGN PATENT DOCUMENTS

TW    201202876 A    1/2012

OTHER PUBLICATIONS

International Search Report and Written Opinion of the ISA issued in PCT/US2020/024478, mailed Jul. 10, 2020; ISA/KR.
(Continued)

*Primary Examiner* — Jigneshkumar C Patel

(57) ABSTRACT

For etching tools, a neural network model is trained to predict optimum scheduling parameter values. The model is trained using data collected from preventive maintenance operations, recipe times, and wafer-less auto clean times as inputs. The model is used to capture underlying relationships between scheduling parameter values and various wafer processing scenarios to make predictions. Additionally, in tools used for multiple parallel material deposition processes, a nested neural network based model is trained using machine learning. The model is initially designed and trained offline using simulated data and then trained online using real tool data for predicting wafer routing path and scheduling. The model improves accuracy of scheduler (Continued)

pacing and achieves highest tool/fleet utilization, shortest wait times, and fastest throughput.

55 Claims, 18 Drawing Sheets

(51) Int. Cl.
    *C23C 16/52*     (2006.01)
    *H01J 37/32*     (2006.01)

(52) U.S. Cl.
    CPC .. *G05B 19/41885* (2013.01); *H01J 37/32926* (2013.01); *G05B 2219/39001* (2013.01); *G05B 2219/45031* (2013.01); *G05B 2219/45212* (2013.01); *H01J 2237/334* (2013.01)

(58) Field of Classification Search
    USPC ........................................................ 700/100
    See application file for complete search history.

(56) References Cited

U.S. PATENT DOCUMENTS

| | | |
|---|---|---|
| 2008/0208372 A1 | 8/2008 | Pannese |
| 2016/0126120 A1 | 5/2016 | Oza et al. |
| 2017/0109646 A1 | 4/2017 | David |
| 2018/0076064 A1* | 3/2018 | Wu ................. G05B 19/41865 |
| 2019/0079503 A1 | 3/2019 | Unterguggenberger et al. |
| 2019/0086906 A1 | 3/2019 | Emani |
| 2019/0391569 A1* | 12/2019 | Emani .............. G05B 19/41865 |
| 2020/0012267 A1* | 1/2020 | Emani .............. G05B 19/41865 |
| 2021/0263505 A1* | 8/2021 | Zheng .................... G06N 3/086 |
| 2021/0405625 A1* | 12/2021 | Wang ................ H01L 21/67276 |

OTHER PUBLICATIONS

Taiwanese Office Action for Taiwanese Application No. 109110186 dated Nov. 2, 2023.

* cited by examiner

MODEL-BASED SCHEDULING FOR SUBSTRATE PROCESSING SYSTEMS

CROSS-REFERENCE TO RELATED APPLICATIONS

The present disclosure is a U.S. National Phase Application under 35 U.S.C. 371 of International Application No. PCT/US2020/024478, filed on Mar. 24, 2020 which claims the benefit of U.S. Patent Application No. 62/826,185 filed on Mar. 29, 2019. The entire disclosures of the applications referenced above are incorporated herein by reference.

FIELD

The present disclosure relates generally to substrate processing systems and more particularly to model-based scheduling for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor manufacturers use one or more substrate processing tools to perform deposition, etching, cleaning, and/or other substrate treatments during fabrication of semiconductor wafers. Each of the substrate processing tools may include a plurality of processing chambers that perform the same type of treatment (such as deposition, etching, or cleaning) or different treatments such as a series or sequence of treatments on substrates.

The processing chambers in the substrate processing tools usually repeat the same task on multiple substrates. The processing chambers operate based on a recipe that defines process parameters. For example, a recipe defines sequencing, operating temperatures, pressures, gas chemistry, plasma usage, parallel modules, periods for each operation or sub-operation, substrate routing path, and/or other parameters. The substrates may be transferred between two or more processing chambers in a particular sequence to undergo different treatments.

SUMMARY

A system for processing semiconductor substrates in a tool comprising a plurality of processing chambers configured to process the semiconductor substrates according to a recipe, comprises a processor and memory storing instructions for execution by the processor. The instructions are configured to receive first data from the tool regarding processing of the semiconductor substrates in the plurality of processing chambers according to the recipe, and to receive second data regarding a configuration of the tool and the recipe. The instructions are configured to simulate, using the second data, a plurality of processing scenarios and scheduling parameters for the plurality of processing scenarios for processing the semiconductor substrates in the plurality of processing chambers according to the recipe. The instructions are configured to simulate the processing of the semiconductor substrates in the plurality of processing chambers according to the recipe using the plurality of processing scenarios and the scheduling parameters for the plurality of processing scenarios. The instructions are configured to train a model using the first data and data generated by the simulation to predict optimum scheduling parameters for processing the semiconductor substrates in the plurality of processing chambers according to the recipe. The instructions are configured to receive inputs from the tool regarding processing of one of the semiconductor substrates in the plurality of processing chambers according to the recipe. The instructions are configured to predict based on the inputs, using the model, optimum scheduling parameters for processing the one of the semiconductor substrates in the plurality of processing chambers according to the recipe. The instructions are configured to schedule operations of the tool based on the optimum scheduling parameters for processing the one of the semiconductor substrates in the plurality of processing chambers according to the recipe.

In another feature, the instructions are configured to execute the operations of the tool based on the optimum scheduling parameters for processing the one of the semiconductor substrates in the plurality of processing chambers according to the recipe.

In other features, the optimum scheduling parameters minimize idle times for the one of the semiconductor substrates during processing in the plurality of processing chambers according to the recipe, and the optimum scheduling parameters maximize throughput of the tool.

In another feature, the instructions are configured to train the model using a machine learning method including an artificial neural network and support vector regression.

In other features, the instructions are configured to analyze the first data received from the tool and the data generated by the simulation; detect, based on the analysis, patterns regarding preventive maintenance operations, wafer-less auto clean times, wait times, recipe times, and throughput for the tool; and train the model based on the detected patterns.

In another feature, the instructions are configured to train the model to predict the optimum scheduling parameters for one of the plurality of processing scenarios.

In another feature, the instructions are configured to train the model to predict the optimum scheduling parameters for all of the plurality of processing scenarios.

In another feature, the instructions are configured to train the model for performing only etching operations on the one of the semiconductor substrates.

In another feature, the instructions are configured train the model for performing both etching and stripping operations on the one of the semiconductor substrates.

In other features, the model is implemented remotely from the tool, and the instructions are configured to train the model based on data received from multiple tools.

In another feature, the instructions are configured to adjust the model for tool-to-tool variations in configurations and operations.

In other features, the model is implemented in a cloud as software-as-a-Service (SaaS), and the tool is configured to access the model via a network.

In other features, the instructions are configured to train a second model based on data of a second tool, and the model and the second model are implemented remotely from the tool and the second tool. The tool and the second tool are respectively configured to access the model and the second model via one or more networks.

In another feature, the instructions are configured to allow the tool and the second tool to respectively select the model and the second model based on configurations of the tool and the second tool.

In other features, the model is implemented on the tool; and the instructions are configured to predict, using the model, the optimum scheduling parameters for processing the one of the semiconductor substrates in the plurality of processing chambers according to the recipe using data generated by the tool.

In other features, the model is implemented on the tool, and the instructions are configured to adjust the model for any drift in performance of the tool.

In another feature, the first data received from the tool includes data from preventive maintenance operations performed on the tool and data regarding recipe times and wafer-less auto clean times for the tool.

In another feature, the data generated by the simulation includes data generated based on the configuration of the tool, wafer-flow types, run scenarios, recipe times, and wafer-less auto clean times obtained from the tool.

In another feature, the inputs received from the tool include data regarding a number of preventive maintenance operations, recipe times, and wafer-less auto clean times for the tool.

In another feature, the instructions are configured to predict the optimum scheduling parameters by factoring in one or more skipped preventive maintenance operations.

In other features, the instructions are configured to schedule, using the model, a plurality of operations for processing the one of the semiconductor substrates in the plurality of processing chambers according to the recipe. The tool progresses through a plurality of states in response to performing the plurality of operations, respectively. A state of the tool includes indications of resources of the tool and a processing status of the one of the semiconductor substrate. The instructions are configured to, for each of the plurality of states, send to the model a current state of the plurality of states and multiple schedulable operations to progress to a next state of the plurality of states, receive from the model a best operation from the multiple schedulable operations selected by the model based on the current state to progress to the next state, and simulate execution of the best operation to simulate progression to the next state. The instructions are configured to train the model to recommend the best operations as the plurality of operations in response to the tool progressing through the plurality of states when processing the semiconductor substrates in the plurality of processing chambers according to the recipe.

In still other features, a system for processing semiconductor substrates in a tool comprising a plurality of processing chambers configured to process the semiconductor substrates according to a recipe, comprises a processor and memory storing instructions for execution by the processor. The instructions are configured to schedule, using a model, a plurality of operations for processing a semiconductor substrate in the plurality of processing chambers according to the recipe. The tool progresses through a plurality of states in response to performing the plurality of operations, respectively. A state of the tool includes indications of resources of the tool and a processing status of the semiconductor substrate. The instructions are configured to, for each of the plurality of states, send to the model a current state of the plurality of states and multiple schedulable operations to progress to a next state of the plurality of states, receive from the model a best operation from the multiple schedulable operations selected by the model based on the current state to progress to the next state, and simulate execution of the best operation to simulate progression to the next state. The instructions are configured to train the model to recommend the best operations as the plurality of operations in response to the tool progressing through the plurality of states when processing the semiconductor substrate in the plurality of processing chambers according to the recipe.

In other features, the instructions are configured to train the model, using historical data regarding processing of the semiconductor substrates received from the tool and by simulating a plurality of processing scenarios for the tool, to predict optimum scheduling parameters for processing the semiconductor substrate in the plurality of processing chambers according to the recipe. The instructions are configured to receive inputs from the tool regarding processing of the semiconductor substrate in the plurality of processing chambers according to the recipe. The instructions are configured to predict based on the inputs, using the model, optimum scheduling parameters for processing the semiconductor substrate in the plurality of processing chambers according to the recipe. The instructions are configured to schedule, based on the optimum scheduling parameters, the plurality of operations for processing the semiconductor substrate in the plurality of processing chambers according to the recipe.

In another feature, the instructions are configured to execute the plurality of operations based on the optimum scheduling parameters for processing the semiconductor substrate in the plurality of processing chambers according to the recipe.

In other features, the optimum scheduling parameters minimize idle times for the semiconductor substrate during processing in the plurality of processing chambers according to the recipe, and the optimum scheduling parameters maximize throughput of the tool.

In another feature, the instructions are configured to train the model using a machine learning method including an artificial neural network and support vector regression.

In other features, the instructions are configured to analyze the historical data received from the tool and data generated by simulating the plurality of processing scenarios for the tool; detect, based on the analysis, patterns regarding preventive maintenance operations, wafer-less auto clean times, wait times, recipe times, and throughput for the tool; and train the model based on the detected patterns.

In another feature, the instructions are configured to train the model to predict the optimum scheduling parameters for one of the plurality of processing scenarios.

In another feature, the instructions are configured to train the model to predict the optimum scheduling parameters for all of the plurality of processing scenarios.

In another feature, the instructions are configured to train the model for performing only etching operations on the semiconductor substrates.

In another feature, the instructions are configured to train the model for performing both etching and stripping operations on the one of the semiconductor substrates.

In other features, the model is implemented remotely from the tool, and the instructions are configured to train the model based on data received from multiple tools.

In another feature, the instructions are configured to adjust the model for tool-to-tool variations in configurations and operations.

In other features, the model is implemented in a cloud as software-as-a-Service (SaaS), and the tool is configured to access the model via a network.

In other features, the model is implemented on the tool, and the instructions are configured to predict, using the model, the optimum scheduling parameters for processing the semiconductor substrate in the plurality of processing chambers according to the recipe using data generated by the tool.

In other features, the model is implemented on the tool, and the instructions are configured to adjust the model for any drift in performance of the tool.

In another feature, the data received from the tool includes data from preventive maintenance operations performed on the tool and data regarding recipe times and wafer-less auto clean times for the tool.

In another feature, the data generated by simulating the plurality of processing scenarios includes data generated based on a configuration of the tool, wafer-flow types, run scenarios, recipe times, and wafer-less auto clean times obtained from the tool.

In another feature, the inputs received from the tool include data regarding a number of preventive maintenance operations, recipe times, and wafer-less auto clean times for the tool.

In another feature, the instructions are configured to predict the optimum scheduling parameters by factoring in one or more skipped preventive maintenance operations.

In still other features, a tool for processing semiconductor substrates comprises a first robot, a plurality of processing chambers, a second robot, and a controller. The first robot is configured to input the semiconductor substrates into the tool for processing the semiconductor substrates in the tool. The plurality of processing chambers is configured to process the semiconductor substrates in the tool according to a recipe. The second robot is configured to transfer the semiconductor substrates between the plurality of processing chambers according to the recipe. The controller is configured to predict, using a model trained by simulating the tool and the recipe, processing times for processing the semiconductor substrates in the plurality of processing chambers; transfer times for the second robot for transferring the semiconductor substrates between the plurality of processing chambers; a route to transfer the semiconductor substrates between the plurality of processing chambers based on the processing times and the transfer times; and a time when the first robot is to schedule additional semiconductor substrates for processing in the tool based on the processing times and the transfer times. Processing the semiconductor substrates according to the predicted route and processing the additional semiconductor substrates according to the predicted time optimizes wait times for the semiconductor substrates along the predicted route and optimizes throughput of the tool.

In another feature, the controller is configured to further train the model incrementally based on data generated during the processing of the semiconductor substrates and the additional semiconductor substrates in the tool.

In another feature, the controller is configured to predict, using the further trained model, second processing times, second transfer times, and a second route for processing the additional semiconductor substrates in the tool; and a second time to schedule a next set of semiconductor substrates for processing in the tool. Processing the additional semiconductor substrates according to the second route and processing the next set of semiconductor substrates according to the second time further optimizes wait times for the additional semiconductor substrates and the throughput of the tool.

In another feature, the controller is configured to adjust the model in response to any changes to the recipe, the tool, or both.

In another feature, the model comprises a first plurality of neural networks configured to predict the processing times for the plurality of processing chambers, respectively; a second plurality of neural networks configured to predict the transfer times for the first and second robots, respectively; and a third neural network coupled to the first and second plurality of neural networks and configured to predict the route to transfer the semiconductor substrates between the plurality of processing chambers and to predict the time when the first robot is to schedule the additional semiconductor substrates for processing in the tool.

In another feature, the model is further trained by simulating configurations of a plurality of tools and a plurality of recipes.

In another feature, the further trained model is configured to output a recommendation for a tool configuration in response to receiving recipe information as input.

In other features, the recipe is for depositing a plurality of layers on the semiconductor substrates. The plurality of processing chambers includes one or more processing chambers for depositing the plurality of layers, and a preprocessing chamber and a post-processing chamber for respectively processing the semiconductor substrates before and after depositing the plurality of layers. The second robot is configured to transfer the semiconductor substrates between the plurality of processing chambers according to the predicted route to optimize the wait times for the semiconductor substrates. The first robot is configured to schedule the additional semiconductor substrates for processing in the tool according to the predicted time to optimize the throughput of the tool.

In still other features, a system for optimizing throughput and wait times during processing semiconductor substrates in a semiconductor processing tool, comprises a processor and memory storing instructions for execution by the processor. The instructions are configured to simulate, based on a configuration of the semiconductor processing tool and a recipe to be performed on the semiconductor substrates in the semiconductor processing tool, a plurality of routes for routing the semiconductor substrates between a plurality of processing chambers of the semiconductor processing tool. The instructions are configured to simulate processing of the semiconductor substrates in the semiconductor processing tool according to the recipe along the plurality of routes. The instructions are configured to simulate, based on the processing of the semiconductor substrates, a plurality of timing schedules for subsequently processing additional semiconductor substrates in the semiconductor processing tool. The instructions are configured to simulate processing of the additional semiconductor substrates according to the plurality of timing schedules. The instructions are configured to train a model based on data generated by the simulations. The instructions are configured to predict, using the model on the semiconductor processing tool, an optimum route to transfer the semiconductor substrates between the plurality of processing chambers when processing the semiconductor substrates in the semiconductor processing tool according to the recipe. The instructions are configured to predict, using the model on the semiconductor processing tool, an optimum time to schedule the additional semiconductor substrates for processing in the semiconductor processing tool. The instructions are configured to process, in the semiconductor processing tool, the semiconductor substrates according to the optimum route to optimize wait times for the semiconductor substrates along the optimum route. The instructions are configured to process, in the semiconductor processing tool, the additional semiconductor substrates at the optimum time to optimize throughput of the semiconductor processing tool.

In other features, the instructions are configured to train the model based on the data generated by the simulations to predict processing times for processing the semiconductor substrates in the plurality of processing chambers; transfer times for a robot of the semiconductor processing tool for transferring the semiconductor substrates between the plurality of processing chambers; the optimum route for routing the semiconductor substrates between the plurality of processing chambers based on the processing times and the transfer times; and the optimum time to schedule the additional semiconductor substrates for processing in the semiconductor processing tool based on the processing times and the transfer times.

In another feature, the instructions are configured to further train the model incrementally based on data generated during the processing of the semiconductor substrates and the additional semiconductor substrates in the semiconductor processing tool.

In another feature, the instructions are configured to adjust the model for any changes to the recipe, the semiconductor processing tool, or both.

In other features, the instructions are configured to generate the model based on the data generated by the simulations, and the model comprises a first plurality of neural networks configured to predict processing times for processing the semiconductor substrates in the plurality of processing chambers, respectively. The model comprises a second plurality of neural networks configured to predict transfer times for first and second robots, respectively. The first and second robots are respectively configured to transfer the semiconductor substrates into the semiconductor processing tool and between the plurality of processing chambers. The model comprises a third neural network coupled to the first and second plurality of neural networks and configured to predict the optimum route for routing the semiconductor substrates between the plurality of processing chambers and to predict the optimum time to schedule the additional semiconductor substrates for processing in the semiconductor processing tool.

In another feature, the instructions are configured to train the model by simulating configurations of a plurality of semiconductor processing tools and a plurality of recipes.

In another feature, the instructions are configured to train the model to output a recommendation for a tool configuration in response to receiving recipe information as input.

Any of the features described above and below can be implemented separately (i.e., independently of other features described above and below). Any of the features described above and below can be combined with other features described above and below in some implementations.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
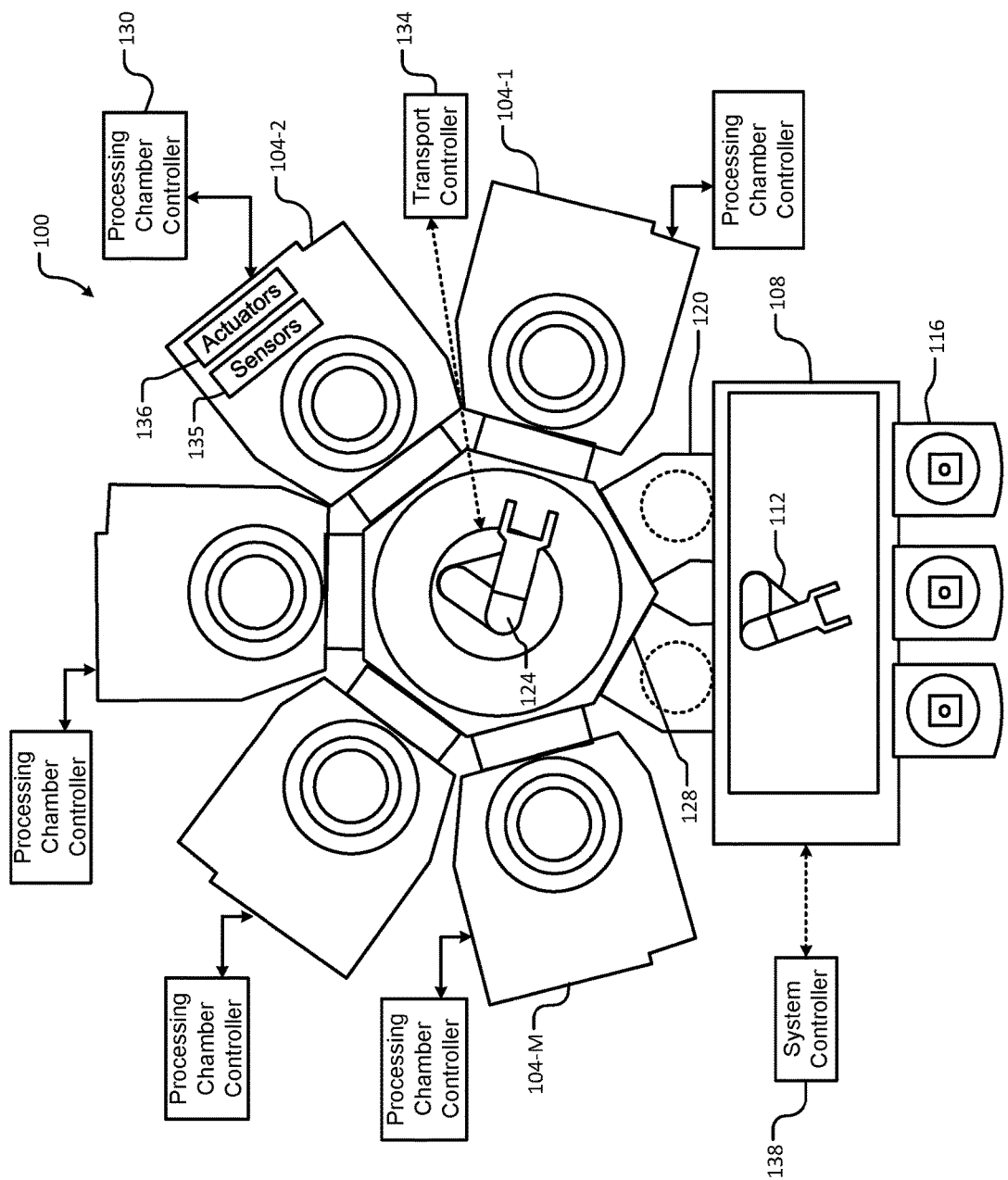
FIG. 1 is a functional block diagram of an example of a substrate processing tool including one or more processing chambers.

Typically, operators of substrate processing tools (hereinafter "the tools") manually select scheduling parameter values based on past experience, experiments, or by using a trial-and-error approach. This is because simple guidelines for selecting the scheduling parameter values cannot be easily established. Since different substrate processing scenarios for a tool (e.g., an etching tool) may require different sets of scheduling parameter values to achieve optimum throughput for the tool, the operator may have to manually enter the scheduling parameter values into a system software controlling the tool before initiating each wafer-flow run on the tool.

In some tools, a scheduler in the system software may use a set of scheduling rules and a scoring system to make scheduling decisions. However, as the complexity of the system configuration, run scenarios, and scheduling constraints of the tool grows, so does the complexity of the scheduling decision making scheme, which in turn requires more development efforts to achieve and maintain optimum system throughput.

Further, in batch (multiple substrates) processing tools used for multiple parallel material deposition processes with restrictions on wafer wait times, pacing a scheduler of a tool to achieve best throughput and least wafer wait time can be very difficult. The scheduler rule is very dynamic, and inaccurate pacing calculations can result in either abnormal wafers due to wafers drying out or drop in throughput, which increases cost-of-ownership for the tool. In addition, different customer applications make pacing prediction more complicated. For example, a long process time recipe (e.g., mega-pillar recipe) makes the process module a bottle neck, and a short process time recipe (e.g., redistribution layer or RDL recipe) makes the back end robot (with several arms to handle batch/multiple substrates together) a bottle neck.

The present disclosure solves these problems by using a trained model and further by using reinforced learning as follows. For the etching tools, a neural network model (hereinafter "the model") is trained to predict optimum scheduling parameter values. The model is trained using data collected from preventive maintenance operations (PMs), recipe times, and wafer-less auto clean (WAC) times as inputs to the model. The model is used to capture underlying relationships between scheduling parameter values and various wafer processing scenarios to make predictions accordingly, which eliminates the need to establish guidelines for best value selection.

Prior to training, a set of important scheduling parameters to be predicted by the model are identified. Large amounts of training data are collected from tools used by semiconductor manufacturers. Additional training data are generated using simulations to cover various processing scenarios used by the semiconductor manufacturers using the tools. The best neural network structure is determined to support a model that can provide a uniform accuracy of prediction across the scheduling parameter space. While a dedicated model for a wafer processing scenario may be used, a single model that can cover various processing scenarios can also be generated by training a model over time using data gathered from other processing scenarios.

For ease of model maintenance, the model may be run outside of the system software of a tool. That is, the model may be external to, separate from, and not integrated into the system software of the tool. The model can receive input parameters from the system software based on a wafer-flow selected by the operator. The model can then compute and predict the best scheduling parameter values and send them back to the system software. For example, the equipment manufacturer can deploy model in a cloud as a software-as-a-service to which the semiconductor manufacturers can subscribe. Alternatively, the equipment manufacturer can the model into the system software of the tool.

Using the trained model allows the underlying behavior of a scheduler built into the system software to be captured into a neural network model, which can then be used to predict the best scheduling parameter values to be used. Operators no longer need to perform extensive simulation studies to select the best scheduling parameter values. Using the trained model also allows the system software to automatically select the scheduling parameter values when a new wafer-flow is to be started.

Additionally, scheduling rules and scoring system of the scheduler can be replaced with the neural network model. The model is trained using a discrete event simulator and reinforcement learning to self-explore and memorize the best scheduling decisions for a given state of a system. This allows achieving and maintaining optimum throughput performance of the system.

The self-exploration process uses the discrete event simulator to automate efforts to find the best possible way to operate a system (e.g., to find the best path in which to move a wafer through a tool) at optimum throughput performance. By running the self-training process on a tool, the neural network model can be optimized for a specific tool configuration, wafer processing scenario, and constraints unique to the tool.

Accordingly, the present disclosure provides a smart machine-learning assisted scheduler. The smart scheduler uses a self-learning process to train a neural network model to make best scheduling decisions for a given state of the system. The decisions help in achieving and maintaining the tool in optimum throughput condition subject to run scenarios and scheduling constraints specific to a semiconductor manufacturer.

For example, the smart scheduler can ensure that a wafer idle time can be less than 2% of the total processing time and a manufacturing efficiency (actual/theoretical cycle time) can be greater than 97% for each recipe. Additionally, the smart scheduler can compensate for tool-to-tool variations as well as for performance drift within the same tool that can occur over time. Further, the smart scheduler can optimize the scheduling parameter values by taking into account preventive maintenance that may have to be skipped or delayed to meet manufacturing deadlines. These and other features of the smart scheduler are described below in detail.

Further, as explained below, to improve the accuracy of scheduler pacing used in tools for multiple parallel material deposition (e.g., multi-layer plating) processes, the present disclosure proposes a machine learning method based on nested neural networks for accurately predicting scheduler pacing for different processes. Using the method, a model is developed and trained initially offline using simulation and then online using the actual tool for predicting wafer routing path and scheduling to achieve highest tool/fleet utilization, shortest wait times, and fastest throughput.

The present disclosure is organized as follows. An example of a tool is shown and described with reference to FIG. 1. An example of a substrate processing system including a processing chamber is shown and described with reference to FIG. 2. An example of a data collection system to collect data from various tools is shown and described with reference to FIG. 3. A system for generating and training a machine-learning assisted model is shown and described with reference to FIG. 4. A method for generating and training the machine-learning assisted model is shown and described with reference to FIGS. 5A-8. An example of a deep neural network used to generate the models described herein is shown and described with reference to FIGS. 9-11. A system for training a reinforcement learning model using a discrete event simulator is shown and described with reference to FIG. 12. A method for training the reinforcement learning model using the discrete event simulator is shown and described with reference to FIG. 13. A system for training a model with nested neural networks using an offline simulator and online real-time tool data for scheduling and pacing wafer processing in tools is shown and described with reference to FIG. 14. A method for training a model with nested neural networks using an offline simulator and online real-time tool data for scheduling and pacing wafer processing in tools is shown and described with reference to FIGS. 15A and 15B. An example of a tool comprising a plurality of processing modules (e.g., electroplating cells) is shown and described with reference to FIG. 16. An example of a processing module of the tool of FIG. 16 is shown and described with reference to FIG. 17. An example of a fab data collection system used in conjunction with the offline simulator to train a model for scheduling and pacing wafer processing in tools is shown and described with reference to FIG. 18.

FIG. 1 shows an example of a substrate processing tool 100. The substrate processing tool 100 includes a plurality of processing chambers 104-1, 104-2, . . . , and 104-M (collectively processing chambers 104) (where M is an integer greater than one). For example only, each of the processing chambers 104 may be configured to perform one or more types of substrate treatment. In other words, the substrates may be loaded into one of the processing chambers 104, processed, and then moved to one or more other one of the processing chambers 104 (if at least one performs a different treatment) and/or removed from the substrate processing tool 100 (if all perform the same treatment).

Substrates to be processed are loaded into the substrate processing tool 100 via ports of a loading station of an atmosphere-to-vacuum (ATV) transfer module 108. In some examples, the ATV transfer module 108 includes an equipment front end module (EFEM). The substrates are then transferred into one or more of the processing chambers 104. For example, a transfer robot 112 is arranged to transfer substrates from loading stations 116 to airlocks, or load locks, 120, and a vacuum transfer robot 124 of a vacuum transfer module 128 is arranged to transfer substrates from the load locks 120 to the various processing chambers 104.

Processing chamber controllers 130, a transport controller 134 and/or a system controller 138 may be provided. The transport controller 134 control robots 112 and 124, actuators and sensors related to the transportation of substrates to and from the substrate processing tool 100. The processing chamber controllers 130 control operation of the processing chambers 104. Generally, the processing chamber controllers 130 monitor sensors 135 such as temperature sensors, pressure sensors, position sensors, etc. and control actuators 136 such as robots, ports, heaters, gas delivery systems, the ESC, RF generators, etc. The processing chamber controllers 130 associated with the processing chambers 104 generally follow a recipe that specifies the timing of steps, process gases to be supplied, temperature, pressure, RF power, and so on.

Figure 2:
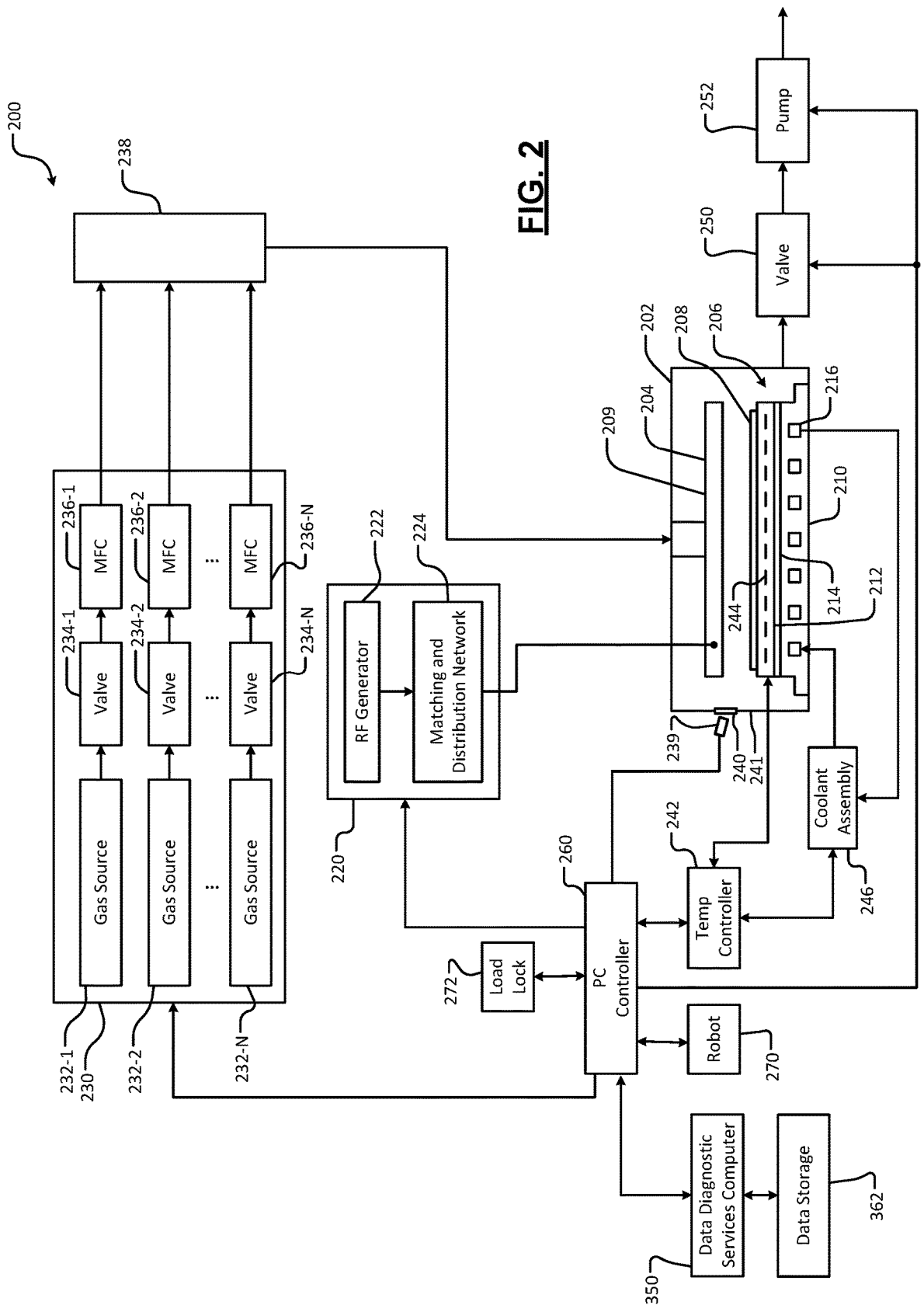
FIG. 2 is a functional block diagram of an example of a substrate processing system include a processing chamber.

FIG. 2 shows an example of a substrate processing system 200 for treating a substrate to illustrate examples of data types that are generated during operation of the processing chamber. While a specific type of processing chamber is shown, other types of processing chambers may be used. The substrate processing system 200 includes a processing chamber 202 that encloses other components of the substrate processing system 200 and contains the RF plasma. The substrate processing system 200 includes an upper electrode 204 and a substrate support, such as an electrostatic chuck (ESC) 206. During operation, a substrate 208 is arranged on the ESC 206.

For example only, the upper electrode 204 may include a showerhead 209 that introduces and distributes process gases such as deposition precursors, etch gases, carrier gases, etc. The ESC 206 includes a conductive baseplate 210 that acts as a lower electrode. The baseplate 210 supports a heating plate 212, which may correspond to a ceramic multi-zone heating plate. A thermal resistance layer 214 may be arranged between the heating plate 212 and the baseplate 210. The baseplate 210 may include one or more coolant channels 216 for flowing coolant through the baseplate 210.

An RF generating system 220 generates and outputs an RF voltage to one of the upper electrode 204 and the lower electrode (e.g., the baseplate 210 of the ESC 206). The other one of the upper electrode 204 and the baseplate 210 may be DC grounded, AC grounded or floating. For example only, the RF generating system 220 may include an RF voltage generator 222 that generates the RF voltage that is fed by a matching and distribution network 224 to the upper electrode 204 or the baseplate 210. In other examples, the plasma may be generated inductively or remotely.

A gas delivery system 230 includes one or more gas sources 232-1, 232-2, . . . , and 232-N (collectively gas sources 232), where N is an integer greater than zero. The gas sources 232 supply one or more deposition precursors, etching gases, carrier gases, etc. Vaporized precursor may also be used. The gas sources 232 are connected by valves 234-1, 234-2, . . . , and 234-N (collectively valves 234) and mass flow controllers 236-1, 236-2, . . . , and 236-N (collectively mass flow controllers 236) to a manifold 238. An output of the manifold 238 is fed to the processing chamber 202. For example only, the output of the manifold 238 is fed to the showerhead 209.

An optical emission spectroscopy (OES) sensor 239 may be arranged adjacent to a window 240 arranged on a chamber surface 241. The OES sensor 239 selectively generates OES data. A temperature controller 242 may be connected to a plurality of thermal control elements (TCEs) 244 arranged in the heating plate 212. For example, the TCEs 244 may include, but are not limited to, respective macro TCEs corresponding to each zone in a multi-zone heating plate and/or an array of micro TCEs disposed across multiple zones of a multi-zone heating plate. The temperature controller 242 may be used to control the plurality of TCEs 244 to control a temperature of the ESC 206 and the substrate 208.

The temperature controller 242 may communicate with a coolant assembly 246 to control coolant flow through the channels 216. For example, the coolant assembly 146 may include a coolant pump and reservoir. The temperature controller 242 operates the coolant assembly 246 to selectively flow the coolant through the channels 216 to cool the ESC 206.

A valve 250 and pump 252 may be used to evacuate reactants from the processing chamber 202. A controller 260 may be used to control components of the substrate processing system 200. A robot 270 may be used to deliver substrates onto and to remove substrates from the ESC 206. For example, the robot 270 may transfer substrates between the ESC 206 and a load lock 272. Although shown as separate controllers, the temperature controller 242 may be implemented in the controller 260.

A significant amount of discrete data and streaming data is generated by the substrate processing tool during processing and transport of substrates. Event data can be used to determine the location and residence time in various components. For example, residence time in a module or front opening unified pod (FOUP) may cause process differences between substrates. Systems logs record system level data. Additional data is recorded during substrate transport. Each of the processing chambers also records data during processing of the substrates. The data that is recorded includes different data types, sampling rates, and/or formats. Some of the data is only stored locally at the processing chamber while other data is stored at a fab level.

Data is usually streamed from the tool to a host in a message format at a fixed frequency. The data is generally not sent on a substrate basis. Rather the data is sent on a time basis. Data is typically collected in files based at a fixed frequency or file size. Data is usually collected continuously and has no bounds. In some systems, the data is collected during processing of an initial and final substrate at recipe start and recipe end, respectively, but not for intervening substrates.

From these data, non-confidential operational data can be collected and analyzed using big data tools and/or machine learning to build and train a model that can provide the best scheduling parameters to improve productivity and system throughput.

In addition, based on the tool configuration and recipe data, additional model training data can be generated using simulation.

The semiconductor manufacturer can combine data from different files having different formats. In some examples, the data collected from customers' tools can a common structured file format that supports encryption and forward/backward compatibility. In some examples, the data format can be consistent with technical data management solution (TDMS) file format. In some examples, the data format can be accessible and can be read by the customer using a key (e.g. an application protocol interface (API) key). The data context and collection can be consistent across the different data types to allow usage and analysis without performing cleaning, reformatting and/or other work on the collected data.

In some examples, the data can be collected from the moment the substrate leaves the cassette until the substrate returns back to the cassette. In some examples, the data can be stored in a single file. In some examples, the file format can be self-consistent. In some examples, the data can be collected at different frequencies based on the type of data and context. In some examples, the data can be formatted using TDMS with encryption. In some examples, a data adapter can be used to support legacy data and backward compatibility, to incorporate new data types, and to support host messaging and streaming data.

Figure 3:
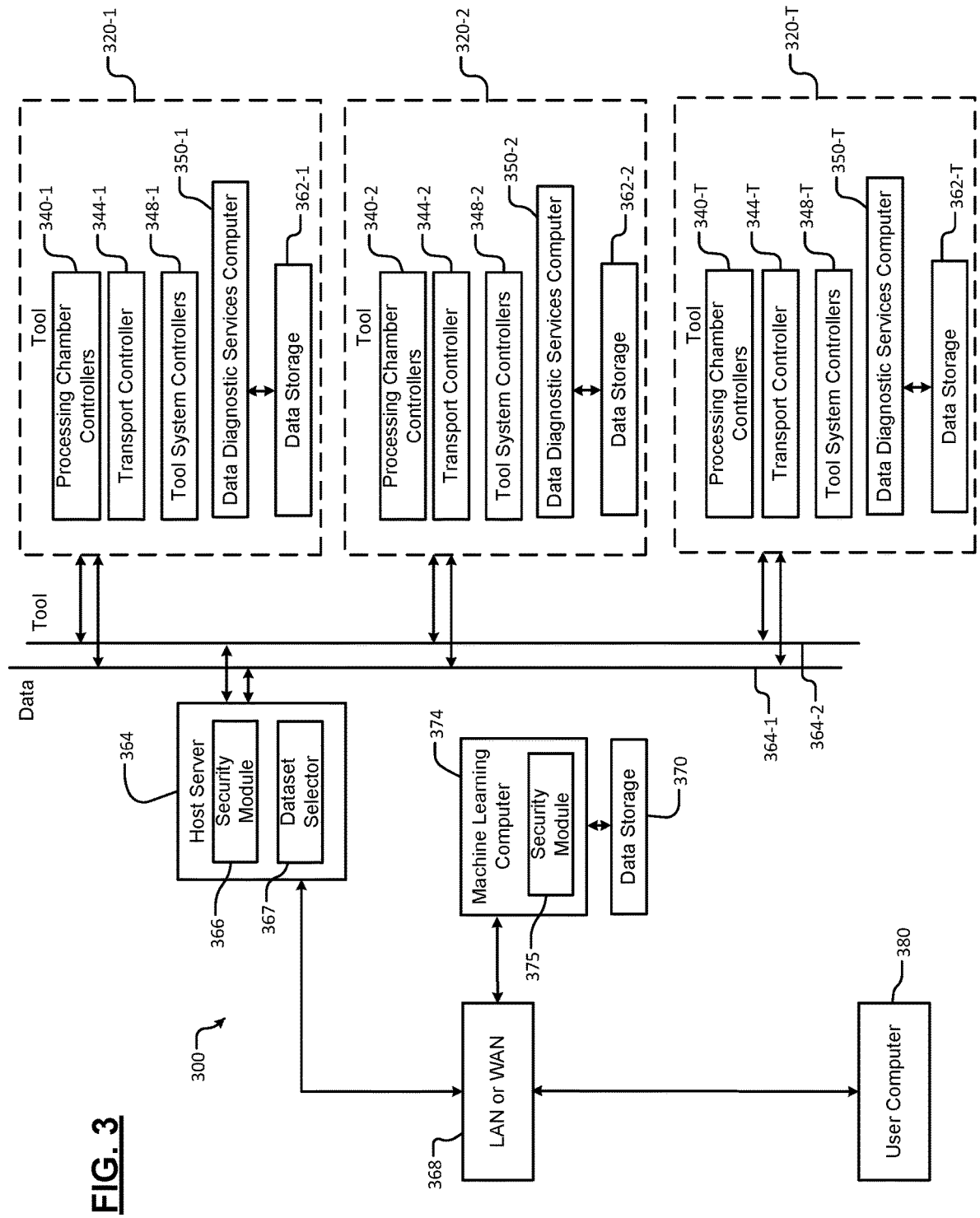
FIG. 3 is a functional block diagram of an example of a data collection system.

FIG. 3 shows a fab data collection system 300 for a semiconductor processing system. The fab data collection system 300 includes N substrate processing tools 320-1, 320-2, ..., and 320-T (where T is an integer) (collectively substrate processing tools 320). Each of the substrate processing tools 320 includes one or more processing chamber controllers 340-1, 340-2, ..., and 340-T (collectively processing chamber controllers 340) to control operation of a processing chamber as described above. Examples of data collected by the processing chambers include substrate or wafer data logs, auto preventive maintenance, high-speed data, optical emission spectroscopy (OES), trace data, OES snapshots, pedestal temperature maps and other data, calibration files, equipment constants, sensor data, and/or other data.

Each of the substrate processing tools 320 may include a transport controller 344-1, 344-2, ..., and 344-N (collectively transport controllers 344) to control dynamic alignment and to store calibration files, platform trace data logs, equipment constants, transfer module activity, and/or other data. Dynamic alignment refers to the location of the substrate relative to other chamber components such as a center of the pedestal, edge ring, or other object.

Each of the substrate processing tools 320 may include a tool system controller 348-1, 348-2, ..., and 348-N (collectively the tool system controllers 348), respectively.

The tool system controllers 348 record lot history, detailed event logs, lot-based alarms, time-based alarms, tool controller health, parts tracking, component history, material scheduling, and other data.

Each of the substrate processing tools 320 further includes a data diagnostic services computer 350-1, 350-2, ..., and 350-N (collectively data diagnostic services computers 350) and data storage devices 362-1, 362-2, ..., and 362-N (collectively data storage devices 362), respectively. In other examples, the data diagnostic services computers 350 may be shared by two or more tools or each tool may include more than one data diagnostic services computer 350. The substrate processing tools 320 are connected by one or more buses such as a tool data bus or network 364-1 and a streaming data bus or network 364-2 to a host server 364.

In some examples, the host server 364 includes a security module 366 and a data selector module 367. The security module 366 provides security such as encryption or password protection. The security module 366 uses encryption or passwords to grant or deny access to data stored by the substrate processing tools 320 and/or to the data selector module 367. The host server 364 further includes a data selector module 367 to allow a user computer 380 to select one or more categories of data from one or more substrate processing tools and filter the data using one or more of the data context fields. In other examples, the security module 366 and/or the data selector module 367 are implemented using separate servers.

The host server 364 is connected by a network 368 such as a WAN or LAN to a machine learning computer 374 and/or one or more user computers 380. The data sets returned by the host server 364 can be made accessible to the machine learning computer 374 for further analysis. In some examples, the machine learning computer 374 includes a security module 375 to control access to the data. The machine learning computer 374 performs machine learning using one or more data files generated by the data collection system 300 as selected by the user. Since the format of the files from the different substrate processing tools is the same, the data can be combined into a single file and analyzed. This allows the same process to be analyzed in multiple machines.

The number T of the substrate processing tools 320 is not limited. Additionally, the substrate processing tools 320 need not be located at the same facility. In some examples, the equipment manufacturer can be granted access to the data stored by multiple semiconductor manufacturers. In some examples, the sampling rates of some or all of the data generating devices (other than streaming or HSD devices) can be aligned to a common sampling period and the data is added to a common file based on the sampling period.

Figure 4:
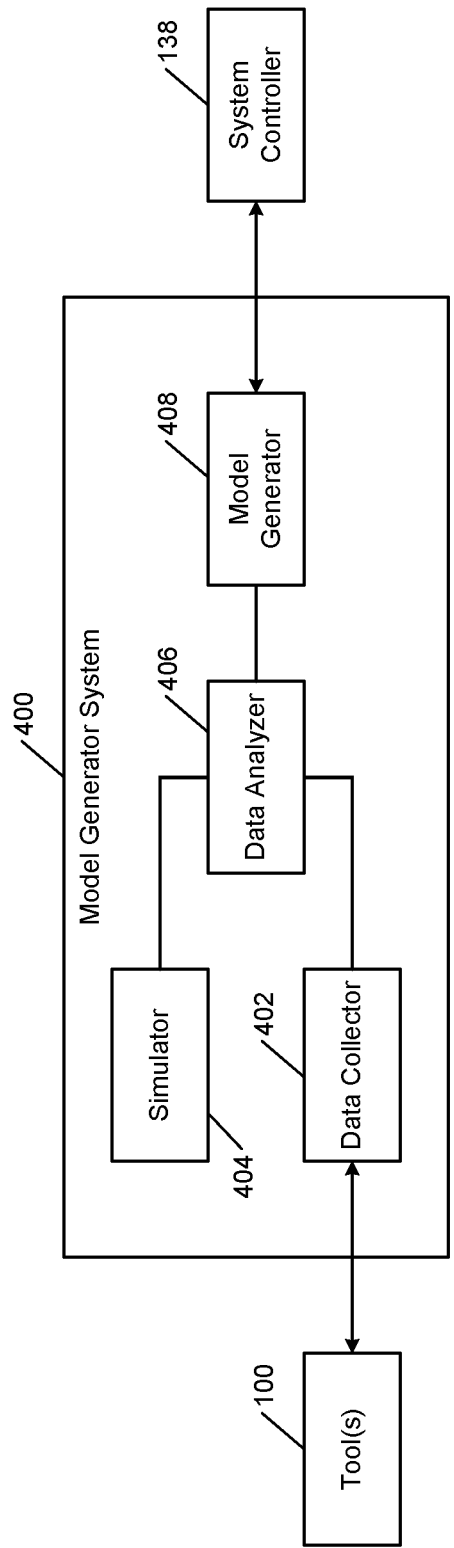
FIG. 4 shows a functional block diagram of a system for generating and training a machine-learning assisted model to schedule wafer processing operations of the substrate processing tool.

FIG. 4 shows a system 400 for generating and training a machine-learning assisted model according to the present disclosure. For example, the system 400 can comprise a machine learning computer (e.g., element 374 shown in FIG. 3). The system 400 comprises a data collector 402, a simulator 404, a data analyzer 406, and a model generator 408. The data collector 402 collects data from one or more tools for generating and training a neural network model. The simulator 404 generates additional training data based on hardware configuration, wafer-flow types, run scenarios, recipe times, and wafer-less auto clean (WAC) times obtained from the tool(s).

The data analyzer 406 analyzes the data collected by the data collector 402 and the data generated by the simulator 404 using techniques used to analyze big data. The data analyzer 406 captures the underlying relationships between the scheduling parameter values and the wafer processing scenarios. The model generator 408 generates a model by applying machine learning techniques to the data analyzed by the data analyzer 406. The model generator 408 defines, trains, and validates one or more models as described below in detail.

In the system 400, all of the elements 402-408 can be implemented by a single computer (e.g., element 374 shown in FIG. 3). Each of the elements 402-408 can be implemented by a separate computer. One or more of the elements 402-408 can be implemented by a separate computer. In other words, the elements 402-408 can be implemented using one or more computing devices.

Each of the computing devices can include one or more hardware processors (e.g., CPUs). Each of the computing devices can include memory that stores instructions corresponding to the methods shown and described below with reference to FIGS. 5A-8. The hardware processors of the computing devices can execute the instructions stored in the memories of the computing devices.

One or more of the elements 402-408 can be communicatively interconnected by one or more networks. For example, the networks may include a LAN, a WAN, the Internet, a cloud-based network system, or any other distributed communication system (e.g., a network system based on client-server architecture).

For example, the data collector 402 may be implemented as the fab data collection system 300 shown in FIG. 3. The data collector 402 collects data from one or more tools (e.g., the tool 100 shown in FIG. 1). The one or more tools may be located at the same customer location. The one or more tools may be located at different locations of the same customer. The one or more tools may be located at different customers' locations. The data collected from the tools excludes proprietary and confidential data of the customers but includes all other operational data that can be used to generate and train a model.

For example only, a tool from which data is collected may be an etching tool and may have the following configuration. The tool may have up to 4 airlocks. The wafer-flow configuration may be 1-level (etch only) and/or 2-level (etch and strip) with a cool station. The recipe types may include wafer processing, wafer-less auto clean, pre- and post-conditioning, and so on. The run scenarios may include single flow and/or multiple flows running in parallel. The tool may include up to six processing chambers including one or more etching chambers, one or more stripping chambers, a cleaning chamber, and so on.

In the system 400, the model generator 408 applies machine learning (ML) methods to the historical data that is obtained from the tools and the simulator 404 and that is analyzed by the data analyzer 406 to generate a throughput predictive model. Using the model, the scheduler of a tool can schedule the processing of wafers using the best scheduling parameters provided by the model for a given tool configuration. Simple linear regression does not work well due to the complex relationships between the underlying variables. Instead, using machine learning methods provides flexibility to handle complex non-linear data. Examples of machine learning methods include artificial neural networks (ANN), support vector regression (SVR), etc.

The model generator 408 may use other approaches instead of or in addition to the machine learning methods. Examples of other approaches include metaheuristic and mathematical methods (e.g., petri net). The metaheuristic method is a branch of artificial intelligence (AI) and is an automatic trial-and-error method to find a near-optimum scheduling pattern to meet pre-defined performance requirements. Scheduling parameter values can then be extracted from the selected scheduling pattern. Examples of algorithms used to find a near-optimum scheduling pattern include genetic algorithm and genetic programming.

Using the selected machine learning method, the model generator 408 trains the model to predict optimum scheduling parameter values. The model is trained using data collected from preventive maintenance operations (PMs), recipe times, and wafer-less auto clean (WAC) times of tools, for example. The model is used to capture underlying relationships between scheduling parameter values and various wafer processing scenarios to make predictions accordingly, which eliminates the need to establish guidelines for best value selection. The model can provide a uniform accuracy of prediction across the parameter space.

The model generator 408 may generate and train a dedicated model for a particular wafer processing scenario. In other words, the model can be trained for a specific tool. Alternatively, the model generator 408 may generate and train a single model that can cover various scenarios. In other words, the model can be trained to work with multiple tools. For example, a dedicated model trained for a specific tool can be further trained to work with multiple tools using data gathered from other scenarios from other tools over time.

To determine if one model can cover all possible scenarios or a dedicated model will be needed, the model generator 408 can apply the selected machine learning method to generate a model based on data collected from multiple tool configurations and run scenarios to check if prediction accuracy can meet success criteria. The success criteria can include whether the model can compensate for tool-to-tool variations as well as for performance drift within the same tool that can occur over time. The success criteria can further include whether the model can optimize the scheduling parameter values by taking into account skipped preventive maintenances. The success criteria can also include whether wafer idle times are less than a small percentage (e.g., 2%) of total processing time for all the wafers, and whether a manufacturing efficiency (actual/theoretical cycle time) can be high (e.g., greater than 97%) for each recipe.

In use, the model can receive input parameters from the system software of a tool (e.g., from the system controller 138 of the tool 100) based on a wafer-flow selected by the operator. For example, the model can receive the number of PMs, recipe times, and WAC times as inputs. The model can then compute and predict the best scheduling parameter values and send them back to the system software. The trained model captures the underlying behavior of the scheduler built into the system software, which can then be used to predict the best scheduling parameter values to be used when processing a set of wafers according to the selected wafer-flow. Using the trained model also allows the tool's system software to automatically select the scheduling parameter values when a new wafer-flow is to be started. The tool operator no longer needs to perform extensive simulation studies to select the best scheduling parameter values.

The model can be implemented in many ways. For example, the model can be integrated into the tool's system software. Alternatively, the model can be implemented independently and remotely from the tool's system software, and the prediction results generated by the model can be supplied to the tool's system software. For example, for ease of model maintenance, the model may be run outside of the system software of a tool. The model can receive input parameters from the system software based on a wafer-flow selected by the operator. The model can then compute and predict the best scheduling parameter values and send them back to the system software. For example, the model can be deployed in a cloud as a software-as-a-service.

When the model is integrated in a tool's system software, the model can generate optimum scheduling parameters for a given run scenario on the tool from the tool's captive data on a per tool basis. Accordingly, in this implementation, the model's prediction is based on actual tool data. The model is also adaptive to tool-to-tool differences. The model can be updated to adjust for tool performance drift. However, in this implementation, intensive computations are performed on the tool itself. Further, the tool's captive data may not be sufficient for the model to provide the best solution. The sufficiency of data can be determined by using the model with a set of data from a tool and evaluating if the dataset is sufficient to predict the best scheduling parameters.

When the model is implemented separately from the tools, the model generator 408 can identify and store a set of optimum configurations and run scenarios per tool and store the set for automatic selection. The simulator 404 can generate training data for various combinations of tool configurations, wafer-flow types, recipe/WAC times, and run scenarios. The model generator 408 can identify the best machine learning method that generates the best prediction model to produce the best system throughput based on the training data set. The model can then be used to generate set of optimum scheduling parameters per tool configuration and scenario. The set of model results can be coded into a user interface to facilitate automatic scheduling parameter selection by the tool operator based on the tool's tool configuration and run scenario selected by the tool operator.

In this implementation, the computation performed on the tool is limited. However, the model generator 408 performs extensive computations to cover various configurations and scenarios of various tools. Further, the model's prediction is based on simulated data and not on the various tools' captive data. Accordingly, the model performance depends on the quality of the simulation data. The model may also be unable to support all possible tool configurations and run scenarios. Further, the model may not be adaptive to differences between tools and may not adjust for tool performance drift.

Figure 5A:
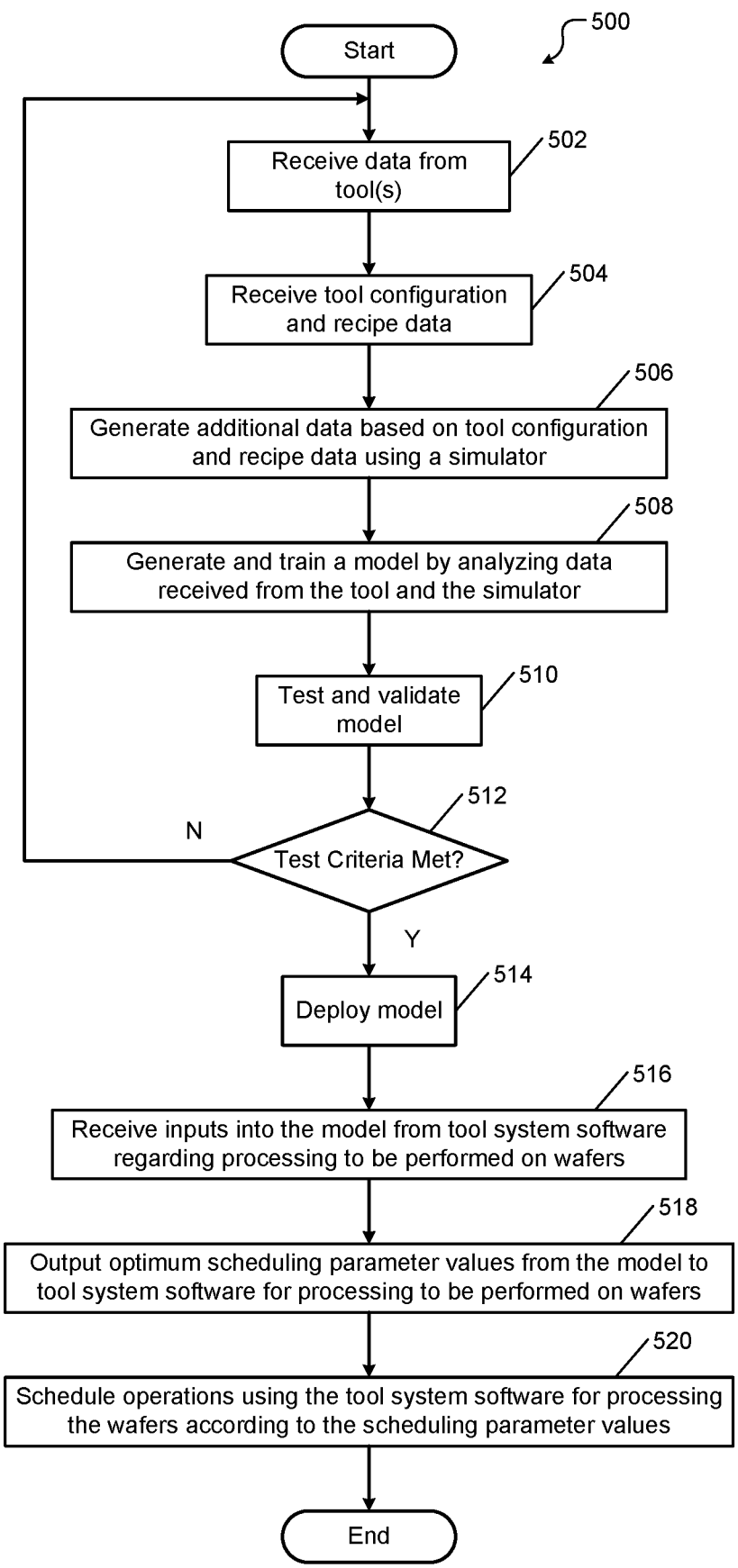
FIGS. 5A-8 show a method for generating and training the machine-learning assisted model.

FIG. 5A shows a method 500 for generating the machine-learning assisted model and operating a tool based on scheduling parameters generated using the model. The method 500 may be executed by the system 400 shown in FIG. 4. For example, one or more of the elements 402-408 of the system 400 may execute one or more of the following steps of the method 500.

At 502, data for generating and training a model is received from one or more tools. At 504, configuration and recipe data for the one or more tools are received. At 506, using a simulator (e.g., element 406 shown and described above with reference to FIG. 4), additional data for generating and training the model is generated based on the configuration and the recipe data. The operation of the simulator is explained in further detail with reference to FIG. 5B.

At 508, using a machine learning method, a model is generated and trained by analyzing the data received from the tools and the simulator. The process of analyzing the data is explained in further detail with reference to FIG. 5C. The model generation and training process is explained in further detail with reference to FIGS. 6 and 7.

At 510, the model is tested and validated. The model validation process is explained in further detail with reference to FIG. 8.

At 512, the method 500 determines whether the test criteria for the model are met. The method 500 returns to 502 if the test criteria are not met. At 514, if the test criteria are met, the model is deployed for use if the test criteria are met. The model is either integrated into the system software of the tool or implemented separately from the system software of the tool is described above.

At 516, the model receives inputs from the system software of the tool regarding processing to be performed on a set of wafers. At 518, based on the receive inputs, the model provides optimum scheduling parameter values to the system software the tool with which to process the set of wafers. At 520, based on the received scheduling parameter values, the system software of the tool schedules operations to process the set of wafers.

Figure 5C:
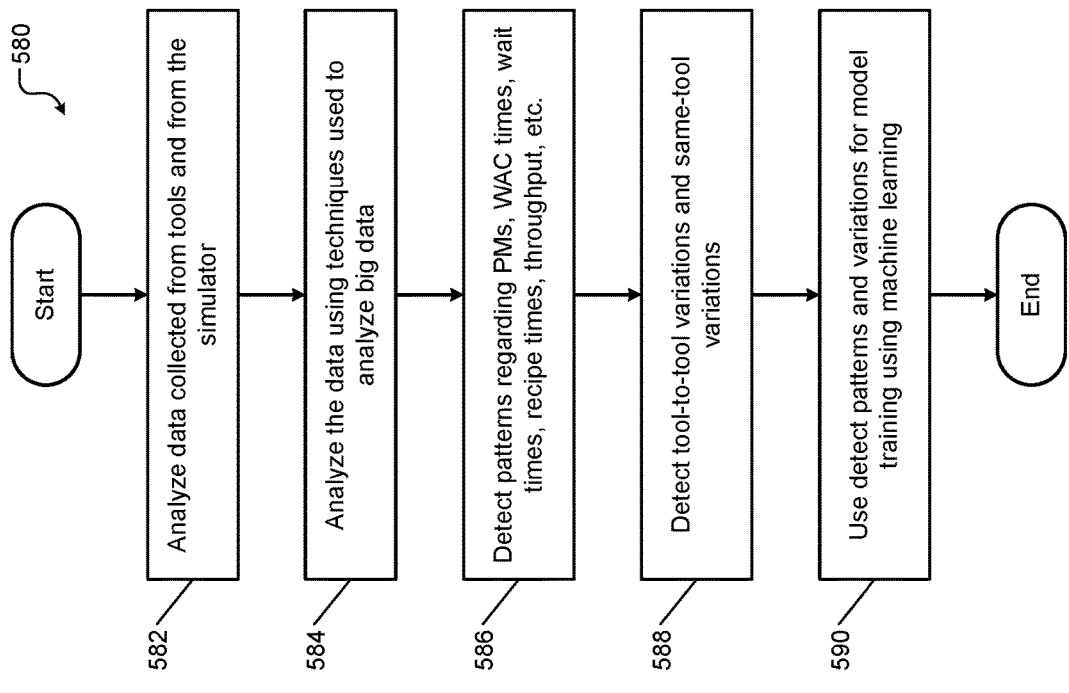
Figure 5B:
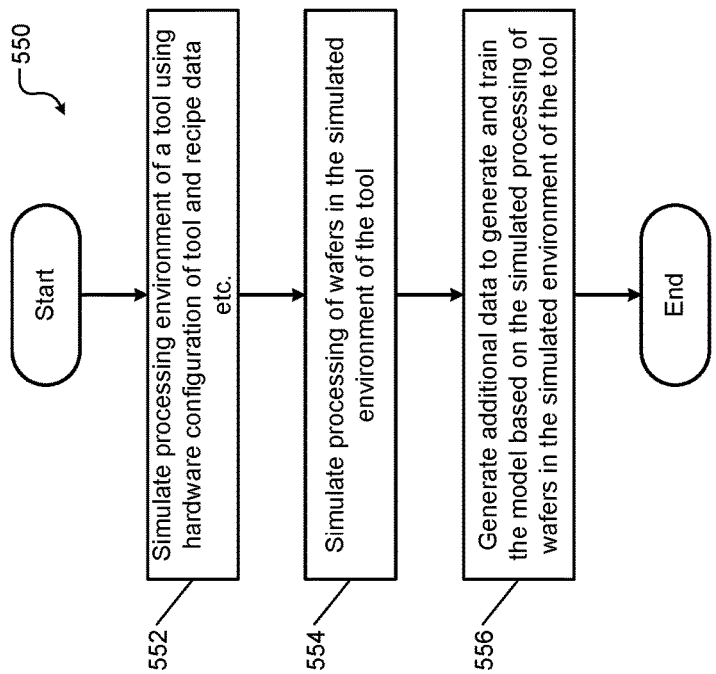

FIG. 5B shows the operation of the simulator 404 as a method 550 executed by the simulator 404. As described at 504 in FIG. 5A, the configuration and recipe data for the one or more tools are received. In FIG. 5B, at 552, the simulator 404 simulates a processing environment of a tool using the hardware configuration of the tool and the recipe data etc. At 554, the simulator 404 simulates the processing of wafers in the simulated environment of the tool. At 556, the simulator 404 generates additional data to generate and train the model based on the simulated processing of the wafers in the simulated environment of the tool.

FIG. 5C shows the operation of the data analyzer 406 in the form of a method 580 executed by the data analyzer 406. As described at 508 in FIG. 5A, a model is generated and trained by analyzing the data received from the tools and the simulator. In FIG. 5C, at 582, the data analyzer 406 analyzes the data collected from the tools and from the simulator 404. At 584, the data analyzer 406 analyzes the data using techniques used to analyze the data.

At 586, the data analyzer 406 detects patterns regarding PMs, WAC times, wait times, recipe times, and throughput for the tool(s) based on the analysis of the collected data. At 588, the data analyzer 406 detects tool-to-tool variations and also same tool variations described above. At 590, the data analyzer 406 provides the detected patterns and variations to the model generator 408 for use in model training using machine learning.

Figure 7:
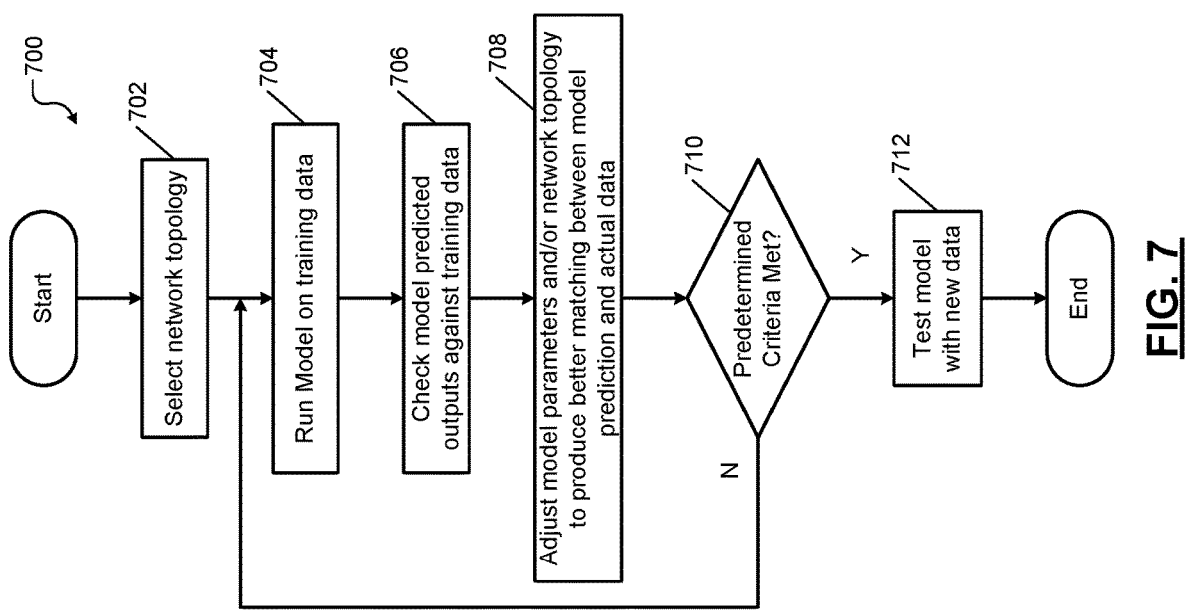
Figure 6:
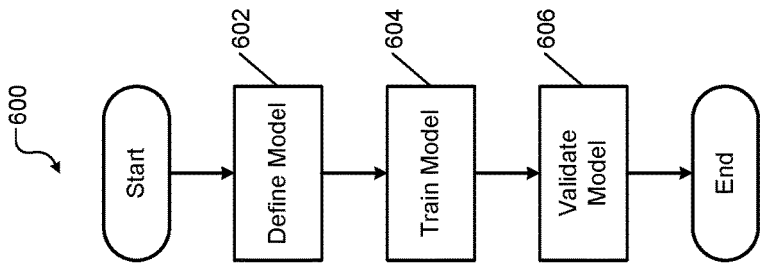

FIGS. 6 and 7 show the model generation and training process in further detail. In FIG. 6, a method 600 for generating the model is shown. At 602, the model is defined. At 604, the model is trained. At 606, the model is validated.

Figure 9:
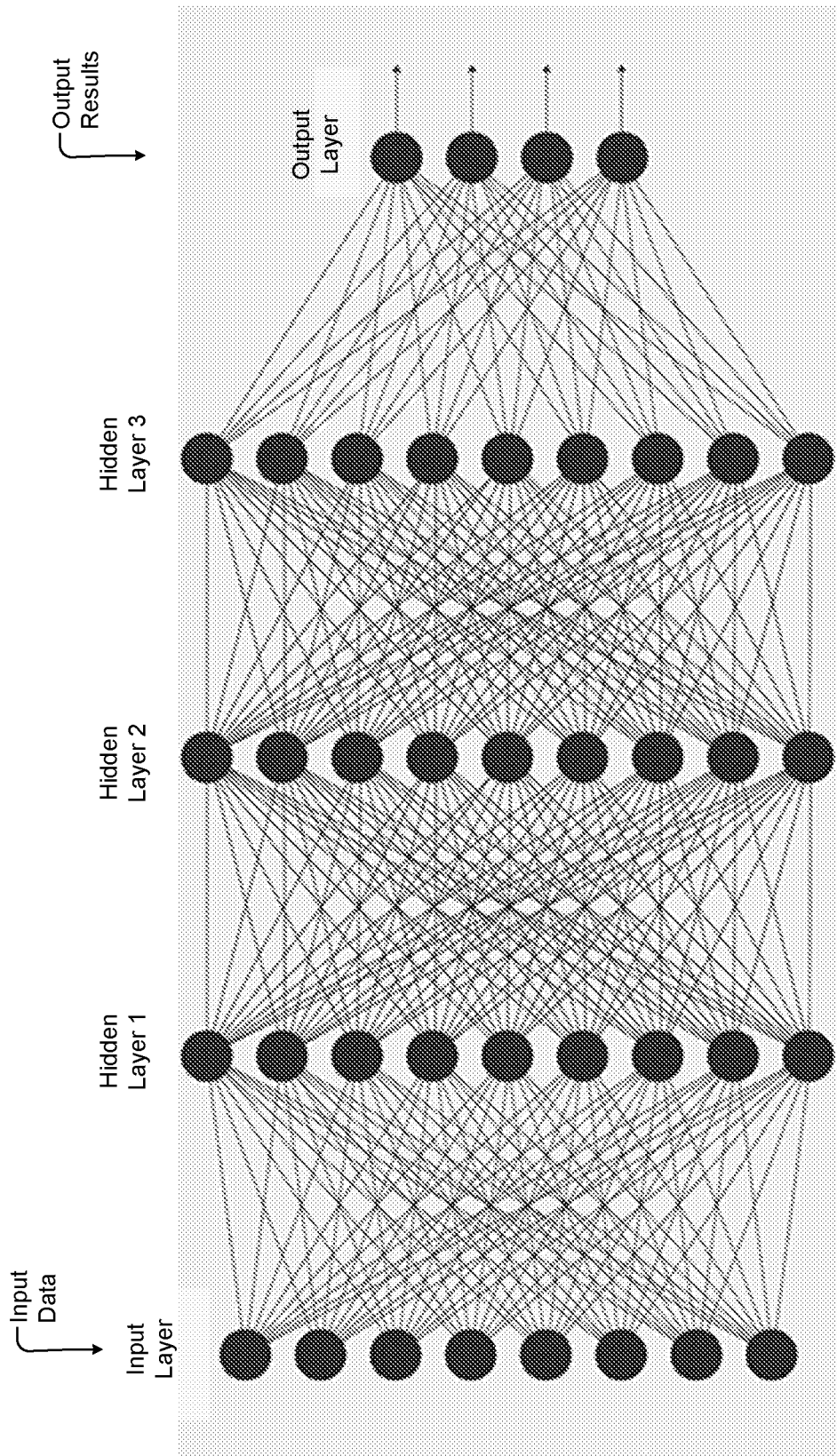
FIGS. 9-11 show an example of a deep neural network used to generate the models described herein.

In FIG. 7, a method 700 for generating the model is shown. At 702, the model is defined by selecting a network topology for a deep neural network. An example of a deep neural network is shown in FIG. 9. For example, selecting a network topology includes selecting number of inputs, number of neurons, and number of layers of the deep neural network.

From 704 to 710, the model is trained. At 704, the model is run on the training data (e.g., data collected from the tools and data generated by the simulator). At 706, the outputs predicted by the model are checked against the training data. At 708, the model parameters and/or network technology are adjusted to produce better matching between the model's predictions and the actual data. At 710, whether the model meets predetermined criteria is determined.

For example, the predetermined criteria include determining whether the model can compensate for tool-to-tool variations and for same-tool performance drift, and whether the model can optimize for unavailable PMs. Further, the predetermined criteria may include determining whether the model outputs ensure a small wafer idle time (e.g., less than 2%) and high manufacturing efficiency (e.g., greater than 97%). The method 700 returns to 704 if one of the predetermined criteria is not met. At 712, in the predetermined criteria are met, the model is validated by testing the model with new data from the tools.

Figure 8:
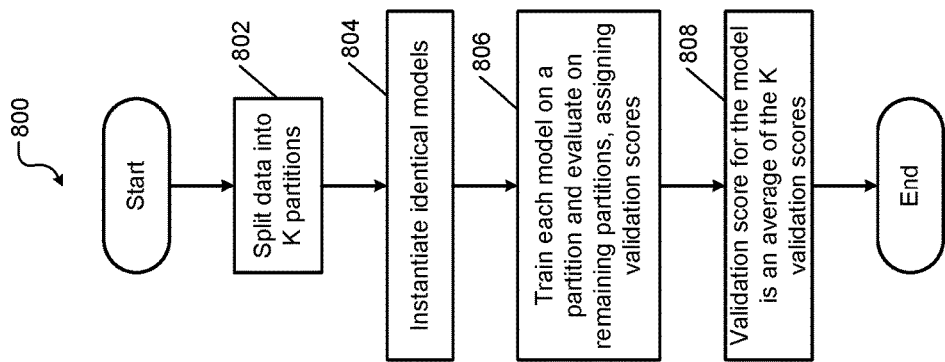

FIG. 8 shows a method 800 for validating the model in further detail. The method is called a K-fold validation method. At 802, the data used for validation is split into K partitions, where K is an integer greater than one. At 804, identical models are instantiated. At 806, each model is trained on one partition and is evaluated on the remaining partitions. Validation scores are assigned for each evaluation. At 808, the validation score for the model is an average of the K validation scores for the model. The model with the highest validation score is deployed for use.

Other validation methods can be used to validate the model. For example, an N-fold cross-validation method may be used. In this method, the total dataset is divided into one final test set and N other subsets, where N is an integer greater than one. Each model is trained on all but one of the subsets to get N different estimates of the validation error rate. The model with the lowest validation error rate is deployed for use.

Figure 10:
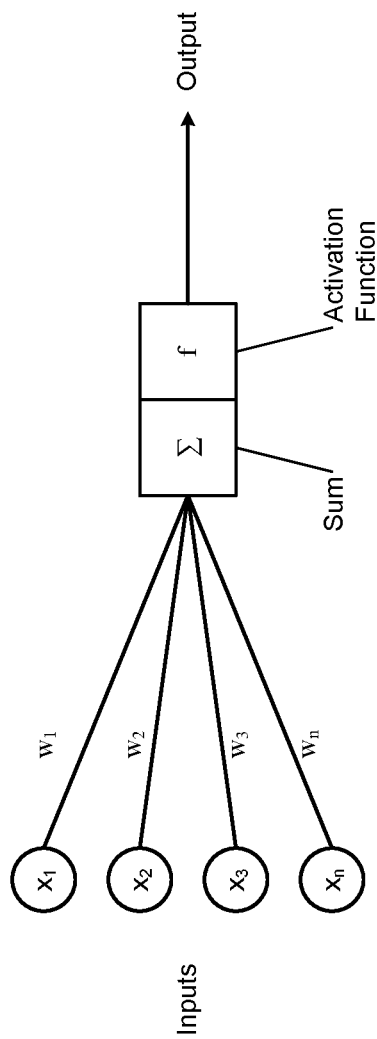

FIGS. 9 and 10 show an example of a deep neural network used to generate the models described herein using machine learning techniques. Machine learning is a method used to devise complex models and algorithms that lend themselves to prediction. The models generated using machine learning can produce reliable, repeatable decisions and results, and uncover hidden insights through learning from historical relationships and trends in the data.

The purpose of using the deep neural network based model and training the model using machine learning is to directly predict dependent variables without casting relationships between the variables into mathematical form. The neural network model comprises a large number of neurons operating in parallel and arranged in layers. The first layer is the input layer and receives raw input data. Each successive layer modifies outputs from a preceding layer and sends them to a next layer. The last layer is the output layer and produces output of the system.

In the input layer, each input node is associated with a numerical value, which can be any real number. In each layer, each connection that departs from an input node has a weight associated with it, which can also be any real number (see FIG. 9). In FIG. 8, a fully connected neural network is shown, where each neuron in a given layer is connected each neuron in a next layer.

In the input layer, the number of neurons equals number of features (columns) in the dataset. The output layer can have multiple continuous outputs. The layers between the input and output layers are hidden layers. The number of hidden layers can be one or more (one hidden layer may be sufficient for most applications). A neural network with no hidden layers can represent linear separable functions or decisions. A neural network with one hidden layer can perform continuous mapping from one finite space to another. A neural network with two hidden layer can approximate any smooth mapping to any accuracy.

The number of neurons can be optimized. At the beginning of training, a network configuration is more likely to have excess nodes. Nodes may be removed from the network during training that would not noticeably affect network performance. For example, nodes with weights approaching zero after training can be removed (pruning). The number of neurons can cause under-fitting (inability to adequately capture signals in dataset) or over-fitting (insufficient information to train all neurons; network performs well on training dataset but not on test dataset).

Various methods can be used to measure performance of a model. For example, root mean squared error (RMSE) measures the average distance between observed values and model predictions. Coefficient of Determination ($R^2$) measures correlation (not accuracy) between observed and predicted outcomes. This method is not reliable if data has large variance. Other performance measures include irreducible noise, model bias, and model variance. High bias indicates that the model is not able to capture true relationship between predictors and the outcome. Model variance can indicate whether the model is not stable (a slight perturbation in the data will significantly change the model fit).

Figure 11:
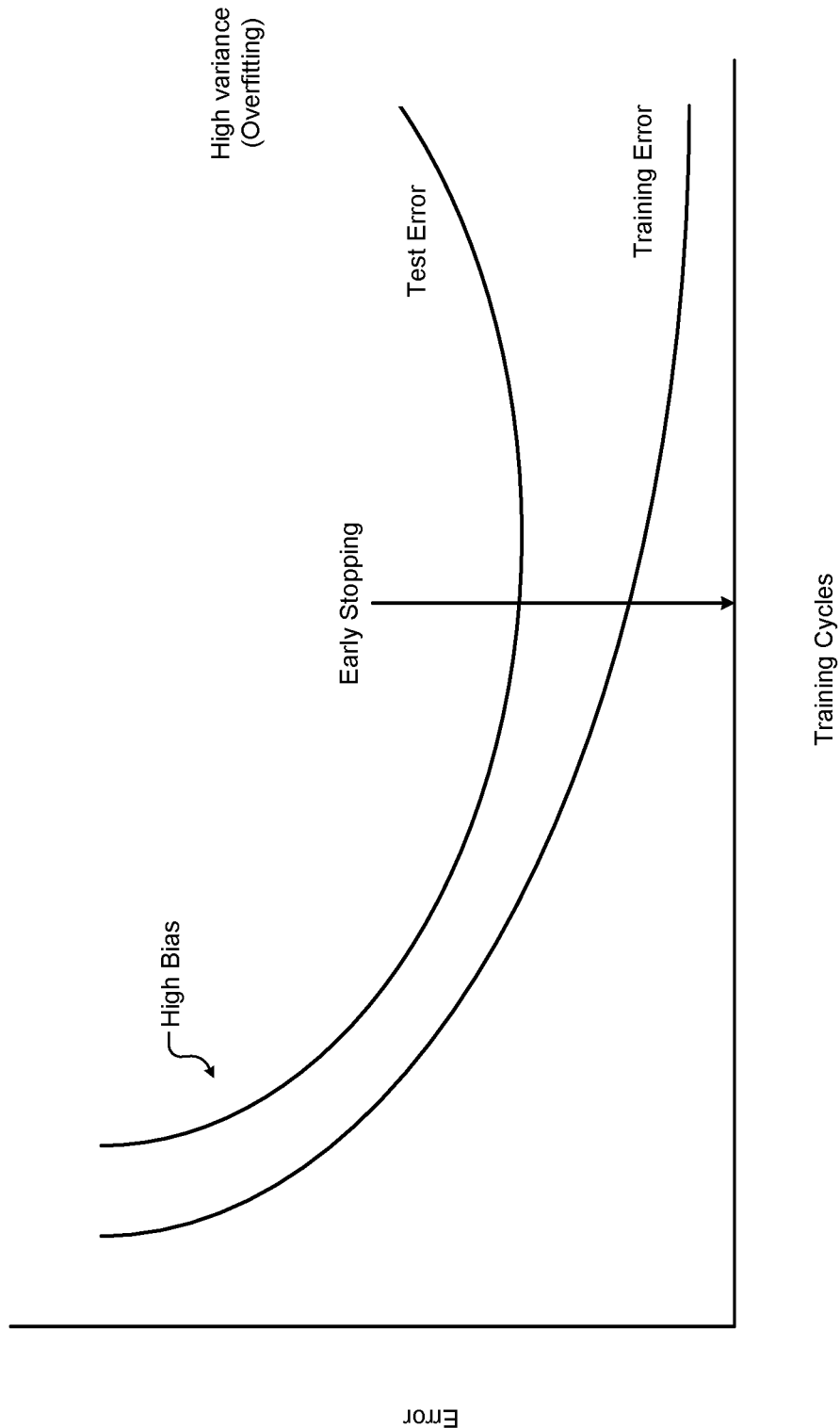

FIG. 11 shows an example of high bias and high variance. High variance can indicate over-fitting. Over-fitting can be prevented using various methods. For example, regularization can be used, where large weights can be penalized using penalties or constraints on their squared values (L2 penalty) or absolute values (L1 penalty). Also, more data can be used. Further, pruning (removing neurons with near-zero weight factors) and/or bagging (training the model on different subsets of the training data) may be used to prevent over-fitting.

Figure 12:
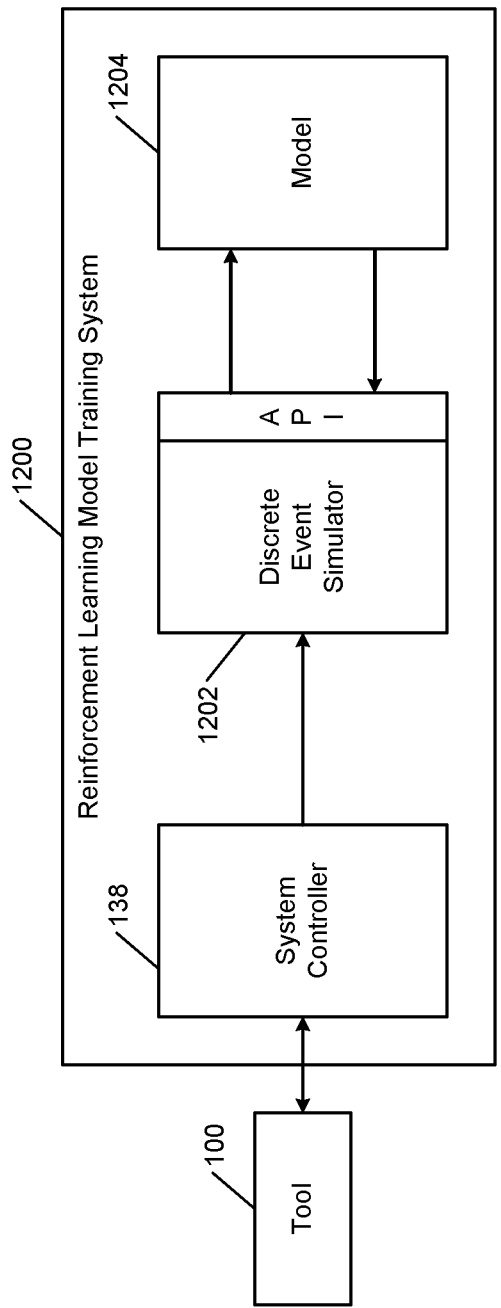
FIG. 12 shows a functional block diagram of a system for training a reinforcement learning model using a discrete event simulator.

FIG. 12 shows a system 1200 for training a reinforcement learning model using a discrete event simulator. For example, the model generated by the system 400 described above can be further trained using reinforcement learning using the system 1200 as described below. The system 1200 comprises a discrete event simulator 1202 and a reinforcement learning model 1204. The discrete event simulator 1202 communicates with a tool's system software (e.g., the controller 138 of a tool 100 shown in FIG. 1 that executes the tool's system software) and the reinforcement learning model 1204 (e.g., the model generated by the system 400 shown in FIG. 4).

In the system 1200, all of the elements 138, 1202, and 1204 can be implemented by a single computer. Each of the elements 138, 1202, and 1204 can be implemented by a separate computer. One or more of the elements 138, 1202, and 1204 can be implemented by a separate computer. In other words, the elements 138, 1202, and 1204 can be implemented using one or more computing devices.

Each of the computing devices can include one or more hardware processors (e.g., CPUs). Each of the computing devices can include memory that stores instructions corresponding to the methods shown and described below with reference to FIG. 13. The hardware processors of the computing devices execute the instructions stored in the memories of the computing devices.

One or more of the elements 138, 1202, and 1204 can be communicatively interconnected by one or more networks. For example, the networks may include a LAN, a WAN, the Internet, a cloud-based network system, or any other distributed communication system (e.g., a network system based on client-server architecture).

Further, the elements 1202 and 1204 can be integrated with the system 400 (e.g., with the model generator 408) shown in FIG. 4. In other words, the system 1200 can be integrated with the system 400.

As mentioned above, in some tools, a scheduler in the system software may use a set of scheduling rules and a scoring system to make scheduling decisions. However, as the complexity of the system configuration, run scenarios, and scheduling constraints of the tool grows, so does the complexity of this scheduling decision making scheme, which in turn requires more development efforts to achieve and maintain optimum system throughput.

The scheduling rules and scoring system of the scheduler can be replaced with the neural network model 1204. The model 1204 can be trained using the discrete event simulator 1200 and reinforcement learning to self-explore and memorize the best scheduling decisions for a given state of a tool. This allows achieving and maintaining optimum throughput performance of the tool.

As explained below in further detail with reference to FIG. 13, the self-exploration process uses the discrete event simulator 1202 to automate efforts to find the best possible way to operate a system (e.g., to find the best path in which to move a wafer through the tool) at optimum throughput performance. By running the self-training process on a tool, the neural network model 1204 can be optimized for a specific tool configuration, wafer processing scenario, and constraints unique to the tool.

The discrete event simulator 1202 is a fast simulator. For example, the discrete event simulator 1202 can simulate a wafer processing sequence that takes about an hour in less than a minute. The discrete event simulator 1202 can simulate 1-level and 2-level wafer processing sequence as well as running WACs in PMs. The discrete event simulator 1202 includes a built in HTTP server based application programming interface (API) to facilitate information exchange between the discrete event simulator 1202 and the model 1204. The discrete event simulator 1202 outputs scheduling cycle information in JSON format via the API. The model 1204 processes the JSON file to select the next operation, which is returned to the discrete event simulator 1202 via the API.

Additionally, the model 1204 includes a deep neural network that is trained using a reinforcement learning method as explained below in further detail with reference to FIG. 13. Reinforcement learning involves an agent, a set of states S and a set A of actions per state. By performing an action 'a' from the set A, the agent transitions from state to state. Executing an action in a specific state provides the agent with a reward (a numerical score). The goal of the agent is to maximize its total (future) reward. The agent achieves the goal by adding a maximum reward attainable from future states to the reward for achieving its current state, which effectively influences its current action by the potential future reward. This potential reward is a weighted sum of the expected values of the rewards of all future steps starting from the current state.

For example, the reinforcement learning method used by the model 1204 can include Q-learning. Q-learning is a reinforcement learning method used in machine learning. The goal of Q-learning is to learn a policy that informs an agent what action to take under what circumstances. Q-learning can handle problems with stochastic transitions and rewards without requiring adaptations. Q-learning finds an optimal policy for any finite Markov decision process (FMDP). Q-learning maximizes the expected value of the total reward over all successive steps, starting from the current state.

Figure 13:
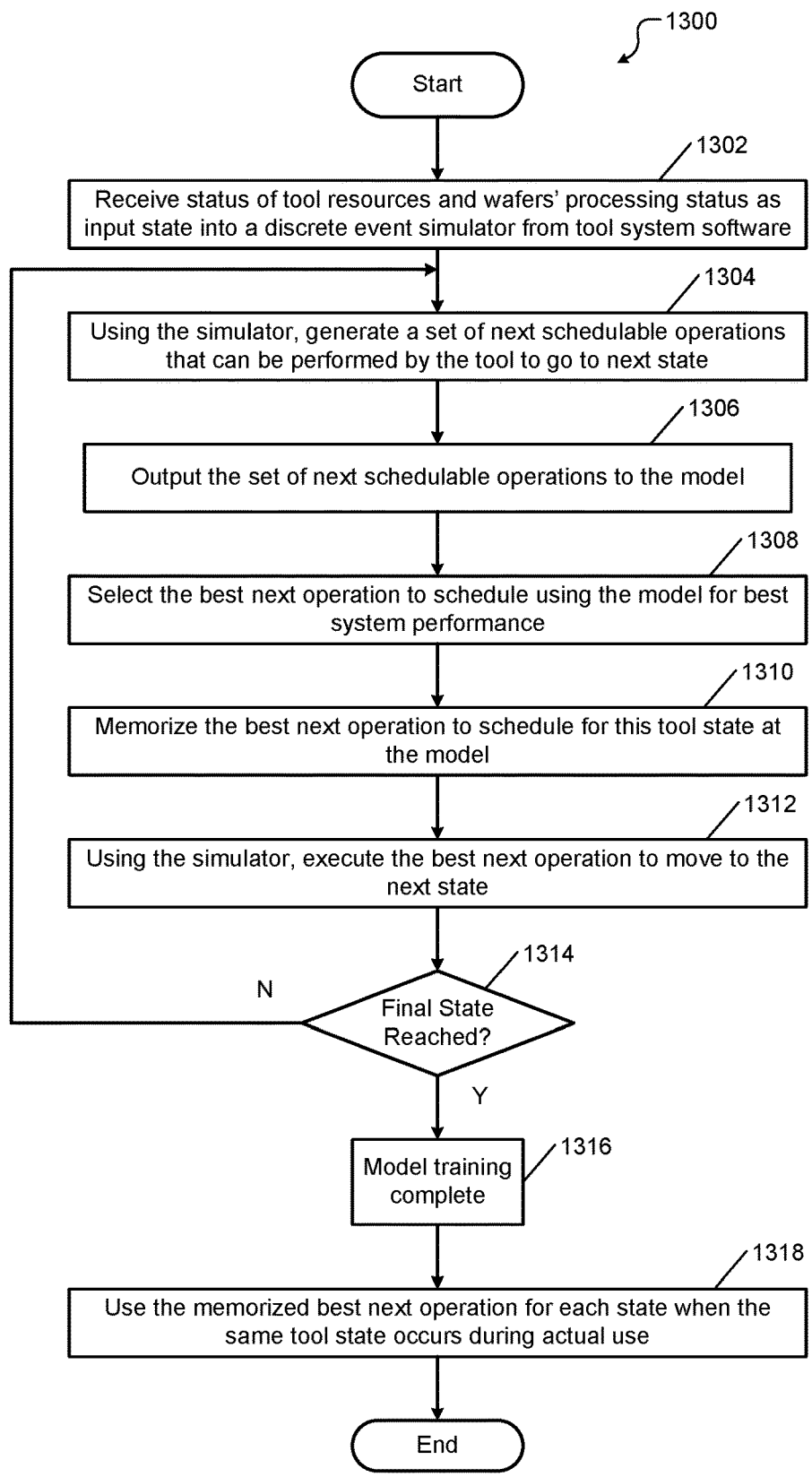
FIG. 13 shows a method for training the reinforcement learning model using the discrete event simulator.

FIG. 13 shows a method 1300 for training the reinforcement learning model 1204 using the discrete event simulator 1202. The method 1300 may be executed by the system 1200 shown in FIG. 12. For example, one or more of the elements 138, 1202, and 1204 of the system 1200 may execute one or more of the following steps of the method 1300.

At 1302, the discrete event simulator 1202 receives data from the tool (e.g., the tool 100 shown in FIG. 1). For example, the discrete event simulator 1202 receives data indicating the current state of the tool from system software running on the system controller 138 of the tool 100. For example, the state information of the tool may include status of tool resources (e.g., PMs, airlocks, etc.) in the processing status of the wafers.

At 1304, the discrete event simulator 1202 generates a set of all possible next scheduled level operations that can be performed by the tool to transition to the next state. At 1306, the discrete event simulator 1202 outputs the set of next scheduled level operations to the model 1204. At 1308, the model 1204 selects the best next operation to schedule that will provide the best system performance. At 1310, the model 1204 memorizes the best next operation to schedule for this tool state. At 1312, the discrete event simulator 1202 executes the best next operation to simulate the next state.

At 1314, the discrete event simulator 1202 determines whether the final state is reached. The discrete event simulator 1202 repeats steps 1304-1312 until the final state is reached. At 1316, after the final state is reached, the reinforcement training of the model 1204 is complete. At 1318, the model 1204 uses the memorized best next operation for each state when that particular state occurs in the tool during actual wafer processing. This way, using the model 1204, the tool always selects the best path in which to move a wafer through the tool for optimum throughput performance when transitioning from one state to another.

Accordingly, the system 1200, together with the system 400, provides a smart machine-learning assisted scheduler. The smart scheduler uses a self-learning process to train the neural network model to make best scheduling decisions for a given state of the system. The decisions help in achieving and maintaining the tool in optimum throughput condition subject to run scenarios and scheduling constraints specific to a semiconductor manufacturer. For example, the smart scheduler can ensure that a wafer idle time can be less than 2% of the total processing time and a manufacturing efficiency (actual/theoretical cycle time) can be greater than 97% for each recipe.

In addition, to improve accuracy of scheduler pacing used in tools for multiple parallel material deposition (e.g., multilayer plating) processes, the present disclosure proposes a nested neural network based model that is trained using machine learning. Specifically, as explained below in detail, the nested neural network based model is initially designed and trained offline using simulated data and then trained online using real tool data for predicting wafer routing path and scheduling. The model achieves highest tool/fleet utilization, shortest wait times, and fastest throughput.

Presently, due to the dynamic nature of scheduler rules used for parallel recipes, the pacing typically has the following issues. Pacing is the ability to predict scheduler behavior (e.g., wafer routing) and to decide when to send a next set of wafers (typically a pair of wafers) into a tool for processing (e.g., plating). Sometimes, the scheduler behavior cannot be predicted accurately. As a result, the wafers may be dispatched into a tool too late or too early. Dispatching the wafers too late reduces the tool throughput, and dispatching the wafers too early reduces the wafer yield due to increased wafer wait time, causing the wafers to dry out. Therefore, the scheduler needs to accurately predict when to send the wafers into the tool so as to achieve maximum throughput and yield.

Specifically, a tool typically uses two robots for wafer transfers: a frontend (FE) robot transfers a pair of wafers into the tool, and a backend (BE) robot transfers the pair of wafers from one processing module in the tool to another processing module in the tool. Same or different processes may be performed on the wafers in one or more processing modules of the tool. The scheduling of both robots needs to be coordinated in conjunction with the availability of the processing modules. Once the wafers enter the tool, the processing modules need to be available in the right sequence at the right times. Otherwise, the wafers have to wait until the next processing module to which they are routed becomes available, which can cause the wafers to dry out, which in turn can reduce the yield.

An additional challenge to the complex scheduling scenario is that processing times for different processes can vary widely (e.g., from a few minutes for one process to nearly an hour for another process). For example, a simple recipe may include processing the wafers with a single layer. In this case, the wafers entering the tool will first transfer to a preprocessing module, then to a plating module, and then to a post-processing module, and then the wafers exit the tool. For a two-layer processing recipe, the wafers entering the tool will first transfer to a preprocessing module, then to a first processing module, then to a second processing module, and then to a post-processing module, and then the wafers exit the tool; and so on. As can be appreciated, recipes with more processing layers can have longer processing times.

However, for some recipes, there may be some flexibility in the tool that can be advantageously utilized to improve the robot scheduling and wafer routing. For example, for a multilayer processing recipe, if the processing material is the same for N layers and if there are N processing modules that can deposit the same processing layer, the wafers can be transferred between any of the N processing modules. This routing flexibility provides an opportunity to have more than one routing paths to transfer the wafers between the N processing modules. However, knowing which of the N processing modules will be available and at what time is essential to coordinate and schedule the wafer routing. Further, knowing the availability of the transfer robot is also essential to coordinate and schedule the wafer routing.

Accordingly, there are various FE/BE robot transfer times for parallel recipes (both tool-to-tool and module-to-module within a tool). The current pacing method typically uses static FE/BE robot reservation times for most scenarios, with no routing path prediction. Further, the current pacing method faces the following dilemma between wafer wait time and throughput: reducing FE/BE robot reservation times can improve throughput but could cause the wafers to wait longer in the processing modules, and increasing FE/BE robot reservation times can minimize the wafer wait time but could create a drop in wafers per hour (WPH) throughput (e.g., in redistribution layer or RDL recipe). Further, presently, the program execution time estimation is not always accurate for different parameter sets and options enabled on these tools.

To solve these problems, the present disclosure proposes a dynamic pacing method (scheduler layer neural network) to predict wafer routing path and throughput based on the following inputs: 1) Tool configurations; 2) recipe structure (e.g., parallel processing modules, single/multiple layers, etc.); 3) accurate program execution time estimations (provided by module layer neural networks based on inputs of parameter set values and options enabled/disabled); 4) states of each processing module on the routing route (e.g., online/offline, number of wafers heading to the processing module, remaining process time, time left before service programs, etc.); and 5) a third layer of neural network that can be added for a fleet of tools for lot dispatching optimization between the tools.

The proposed dynamic scheduler pacing method uses a nested neural network based model trained using machine learning to address the dynamic wafer scheduling issues during wafer processing, and wafer/lot dispatching and routing (at module, tool, and fleet levels). Initially, simulation is used to generate data to train and test the neural networks. Accordingly, the simulation needs to be accurate, which needs accurate program execution time estimates. A neural network layer is used to accurately predict program execution times. In this layer, one neural network is used per processing module to predict the program execution times. Additionally, one neural network is used per robot to predict the transfer times for each robot.

The method employs both offline learning using simulation and online learning using real-time tool data. The offline learning is based on data collected on a simulator or a tool to minimize computational complexity during production. The weights determined for the neural networks during offline training are applied to the scheduler pacing algorithm before wafer/lot dispatching. The online learning is then used to dynamically adjust the neural networks based on real-time data.

Accordingly, in the proposed method, a model for scheduler pacing is built using nested neural networks or other machine learning algorithms. The model is initially built, trained, and tested offsite using simulation. Subsequently, the model is continually refined and trained further onsite on the actual tool by incrementally using data streams from the tool to make further adjustments to the model that reflect the tool-specific and recipe-specific robot transfer times and that compensate for any process drift. The onsite training also adjusts the model for any recipe changes and/or tool hardware changes.

The dynamic scheduler pacing method using nested neural networks improves tool/fleet throughput and utilization of parallel recipes with multiple layer material deposition and restriction of waiting time, and prevents wafer dry out problems. The method can recommend recipe/wafer assignment mix with maximum tool utilization. The method can also predict routing path involving both front end and back end robots and wafer aligner, path inbound to process modules, path between process modules, and path from process to outbound modules. In addition, the method can recommend optimum tool hardware configuration for a given application.

The dynamic scheduler is designed, developed, and implemented in phases. A first phase includes training a single neural network offline as follows. A simulator is used to simulate, using realistic transfer times in actual tools, various scheduling scenarios and wafer routing paths that may be feasible in real tools. The simulator performs these simulations based on hardware configurations of different tools and based on various processes that can be used in the tools for processing wafers. A wafer cycle is simulated based on test scenarios in the simulator in loop mode to collect numerous data sets. A neural network is trained offline using machine learning. The calculated weights (generated by the simulator to optimize wafer scheduling and routing) and neural network inputs are then fed to the scheduler pacing algorithm, and throughput improvement is observed for the same wait time.

In a second phase, a nested neural network is trained offline for one tool of a fleet of tools as follows. In an initial layer of the model, a module level neural network (i.e., a neural network for a processing module) is trained to predict program execution times for different processes. In the same layer, one neural network per robot in the tool is trained to predict transfer times for different processes. In a subsequent layer of the model, the outputs of the neural networks from the initial layer (i.e., the predictions for program execution times and transfer times) are input to a next layer including the scheduler level neural network.

The input for the scheduler level neural network is expanded to other tool configurations, mix of recipe types, process times, multiple layers to be processed on the wafers, scheduler modes, etc. Coupled (i.e., nested) with the module level neural networks, the scheduler level neural network with expanded inputs provides recommendations for best product/recipe/wafer mix to achieve highest tool/fleet utilization to reduce cost-of-ownership for the tools. That is, the nested neural network based dynamic scheduler, which is trained using different tool hardware configurations and different recipe types, can now recommend optimum tool hardware configuration for a given recipe or recipes. Such recommendations can be provided using the simulator-based training alone.

A third phase includes online real-time and unsupervised learning. The online continuous neural network training using machine learning is based on actual production data from one tool or a fleet of tools. The online training is used to dynamically adjust the weights for the inputs to the neural networks that are trained offline using the simulator as described above. Continuous (i.e., ongoing) training is needed since process recipes and/or hardware can change. When such changes occur, the model needs to adapt to the changes, which can be accomplished by continuous training. Thus, the dynamic scheduler grows from supervised to unsupervised machine learning, and develops an ability to learn from its mistakes and make better educated estimations next time.

Due to the continuous nature of the training, the data generated by the tool is auto-labeled to allow incremental training. That is, after one set of wafers is processed in a current process, the data from the current process is automatically labeled so that the data can be used in addition to or instead of the corresponding data from a previous process for incremental learning. These and other aspects of the dynamic scheduler are described below in further detail.

Figure 14:
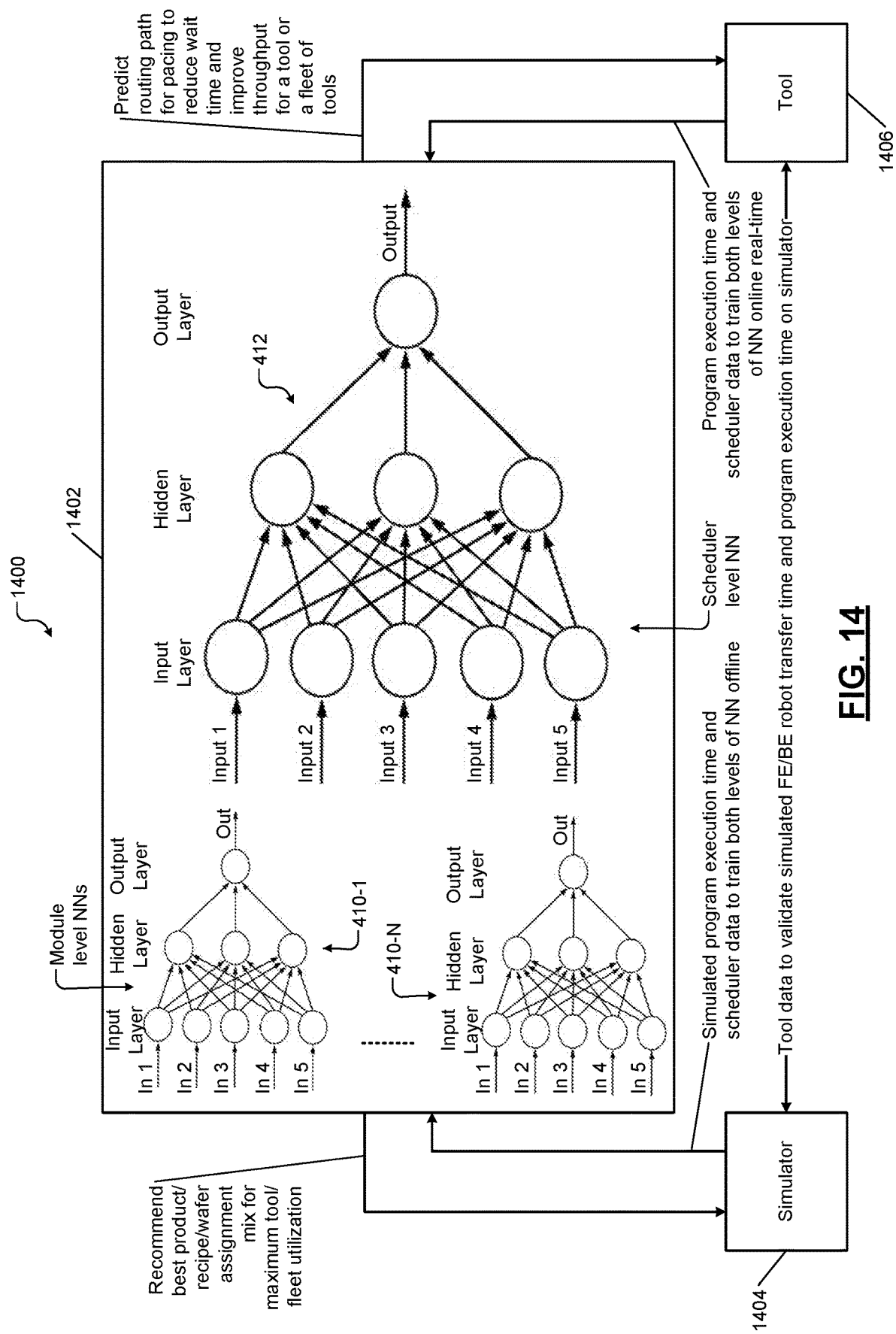
FIG. 14 shows a system for training a model with nested neural networks using an offline simulator and online real-time data from a tool for scheduling and pacing wafer processing in tools.
Figure 15A:
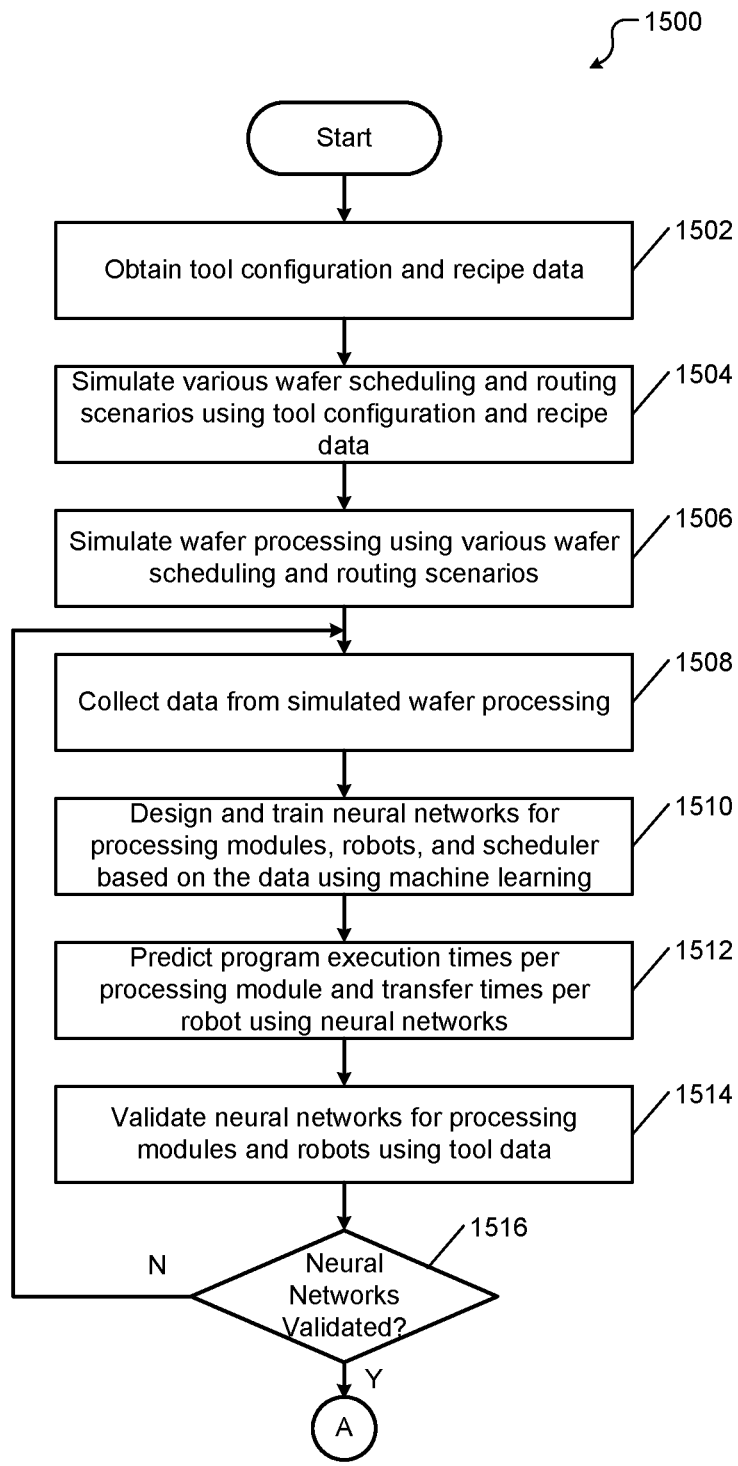
FIGS. 15A and 15B show a method for training a model with nested neural networks using an offline simulator and online real-time tool data for scheduling and pacing wafer processing in tools.
Figure 15B:
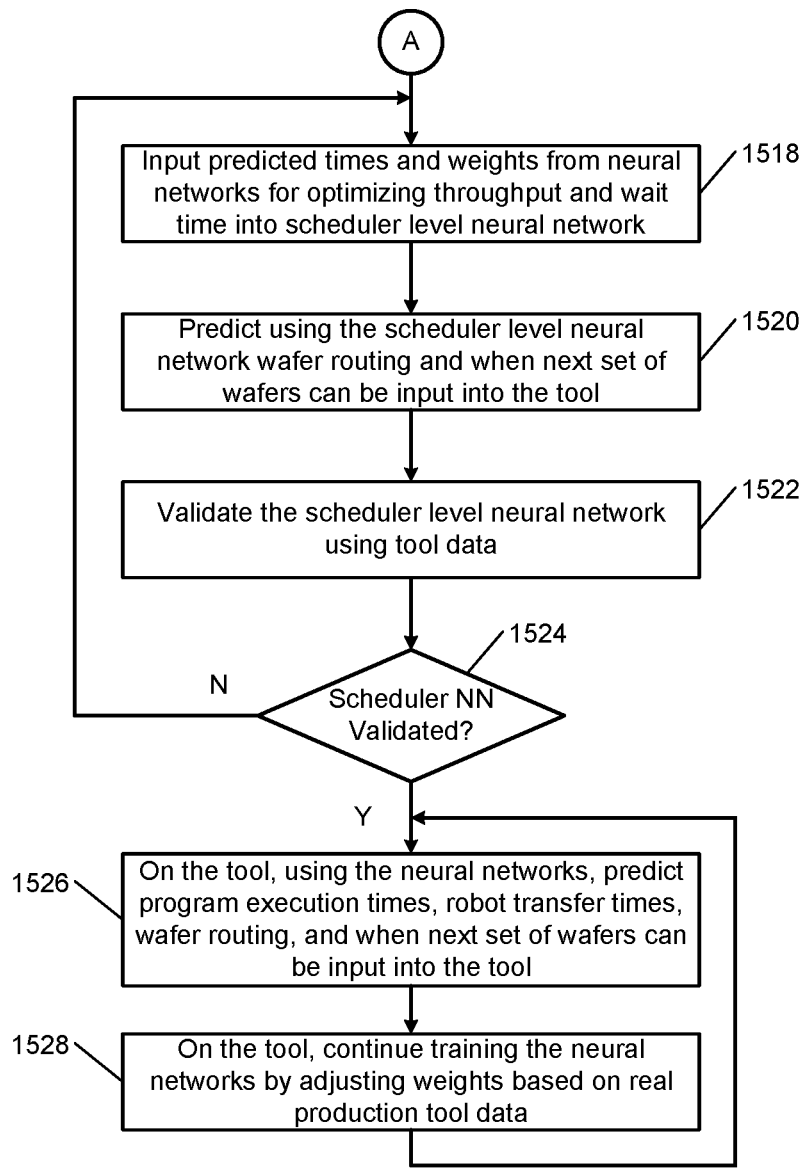
Figure 16:
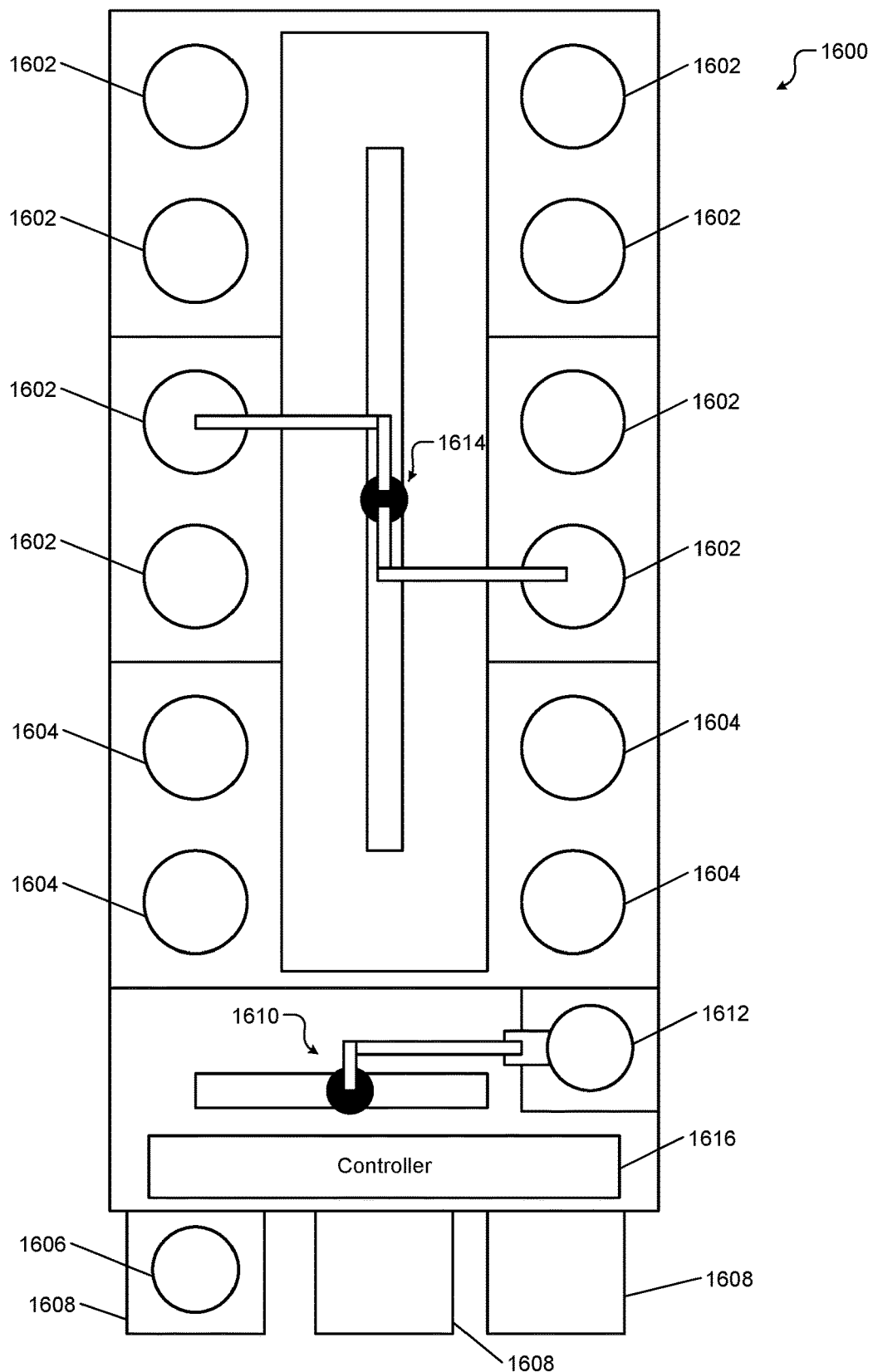
FIG. 16 shows an example of a tool comprising a plurality of processing modules (e.g., electroplating cells)

As used with reference to FIGS. 14-15B, wait time is an amount of time wafers have to wait after processing of the wafers is completed in a processing module until the processing of the wafers can begin in a next processing module. Wait times occur when the next processing module is not ready to process the wafers (e.g., since the next processing module has not yet completed and is still processing other wafers). Program execution time or processing time is an amount of time a processing module takes to complete processing wafers. Transfer time for a robot is an amount of time a robot takes to move wafers from point A to point B (e.g., from one processing module to another or from an airlock to a processing module, and from a loading station of the tool to an airlock).

FIG. 14 shows a system 1400 for training a model 1402 with nested neural networks using an offline simulator 1404 and online real-time data from a tool 1406 (e.g., a tool 1600 shown in FIG. 16) for scheduling and pacing wafer processing in the tool 1406. The model 1402 comprises a plurality of module level neural networks and a scheduler level neural network. The plurality of module level neural networks include one neural network for each processing module (e.g., processing modules 1602 shown in FIG. 16) in the tool 1406 and one neural network for each robot (e.g., for robots 1610 and 1614 shown in FIG. 16) in the tool 1406. These neural networks are shown as 1410-1, . . . , and 1410-N, where N is an integer greater than 1, may be collectively called neural networks 1410. The neural networks 1410 output predictions for program execution times for the processing modules (e.g., processing modules 1602 shown in FIG. 16) and predictions for the robot transfer times (e.g., for robots 1610 and 1614 shown in FIG. 16).

The scheduler level neural network is shown as 1412 and receives outputs of the neural networks 1410 as inputs. The scheduler level neural network 1412 schedules the routing of the wafers between the processing modules within the tool and outputs a prediction for when to transfer a next pair of wafers to the tool for processing. The neural networks 1410 and the scheduler level neural network 1412 output their respective predictions during their training initially on the simulator 1404 and subsequently during actual use and continued training on the tool 1406 (e.g., when implemented by or integrated with a system controller 1616 shown in FIG. 16).

For example only, the simulator 1404 may be implemented using a computing device such as a computer comprising one or more hardware processors (e.g., CPUs) and one or more memory devices storing one or more computer programs that simulate the operating and processing environment of a tool (e.g., the tool 1406) on the computer. The computer programs additionally comprise instructions for generating, training, and validating the neural networks 1410 and the scheduler level neural network 1412 of the model 1402 on the simulator 1404 as explained below with reference to FIGS. 15A and 15B. The one or more hardware processors execute the one or more computer programs.

The simulator 1404 and the tool 1406 may be communicatively interconnected by one or more networks. For example, the networks may include a LAN, a WAN, the Internet, a cloud-based network system, or any other distributed communication system (e.g., a network system based on client-server architecture).

Figure 18:
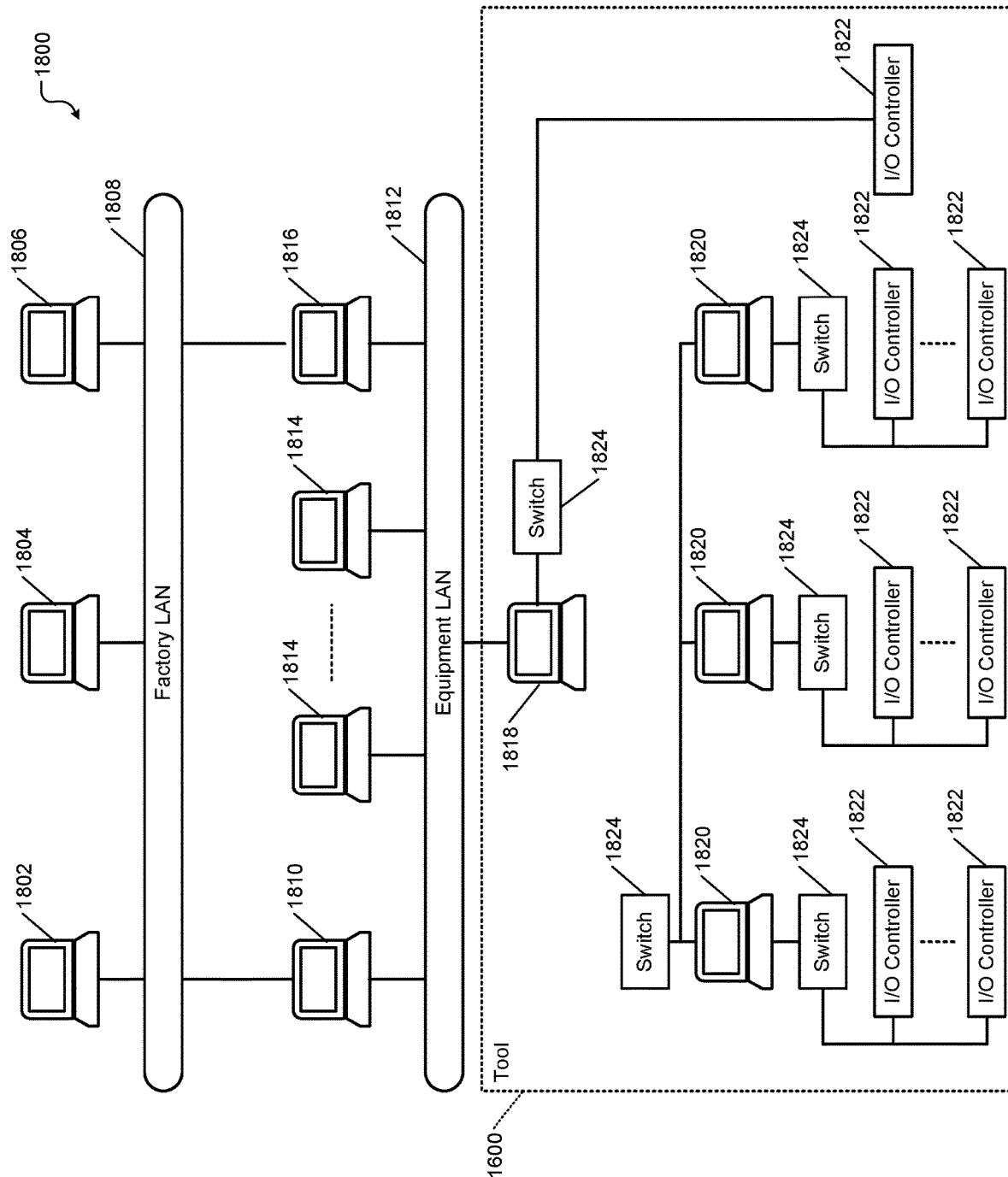
FIG. 18 shows an example of a fab data collection system used in conjunction with the offline simulator of FIG. 14 to train a model for scheduling and pacing wafer processing in tools (e.g., the tool of FIG. 16).

For example, the simulator 1404 may collect/receive data from the tool 1406 using the fab data collection system 1800 shown in FIG. 18. While only one tool is shown in FIG. 14, data may be collected/received from more than one tool. The one or more tools may be located at the same customer location. The one or more tools may be located at different locations of the same customer. The one or more tools may be located at different customers' locations. The data collected from the tools excludes proprietary and confidential data of the customers but includes all other operational data that can be used to generate and train a model.

For example only, the tool 1406 from which data is collected may perform multiple parallel material deposition (e.g., plating) processes and may have the following configuration. The tool may comprise up to two decks and two robots, each deck comprising multiple processing modules. For example, the multiple processing modules may include one preprocessing module, one post processing module, and four processing modules for performing the plating processes. The tool may further comprise a scheduler to control the wafer processing in the tool. The processes may include single layer plating or multilayer plating.

The simulator 1404 simulates the tool configuration and simulates the processing of the wafers in the tool. The simulator 1404 comprises a system or systems that use machine learning to generate, train, and validate the neural networks 1410 and 1412 of the model 1402 using the data generated by the simulator 1404 by simulating the processing of the wafers. Using the trained model 1402, the scheduler of a tool can schedule the processing of wafers while providing the best throughput and wait time. The trained model 1402 can also recommend an optimum hardware configuration for a tool to be used for a given application.

FIGS. 15A and 15B show a method 1500 for generating and training a model with nested neural networks using an offline simulator and online real-time tool data for scheduling and pacing wafer processing in tools. For example, one or more of the simulator 1404 of the system 1400 shown in FIG. 14 and a system controller of the tool 1406 (e.g., element 1616 shown in FIG. 16) may execute one or more of the following steps of the method 1500.

At 1502, the method 1500 obtains data regarding hardware configuration of a tool and recipe up a process (e.g., multilayer plating) to be performed on wafers in the tool. At 1504, using a simulator, based on the obtained data, the method 1500 simulates various routing and scheduling scenarios for processing wafers. At 1506, using the simulator, the method 1500 simulates wafer processing using the various routing and scheduling scenarios.

At 1508, the method 1500 collects data from the simulated wafer processing performed using the simulator. At 1510, using the collected data, the method 1500 designs and trains a plurality of neural networks. The plurality of networks includes one neural network for each of the processing modules in the tool, one neural network for each robot in the tool, and one neural network for a scheduler used by the tool to route wafers within the tool and to schedule when to process the next set of wafers in the tool. For example, the method for generating and training the neural networks may be similar to the method described with reference to FIGS. 6-11.

At 1512, the method 1500 predicts program execution times for each processing module and predicts the robot transfer times using the respective neural networks. At 1514, the method 1500 validates the neural networks for the processing modules and robots using data obtained from the tool.

At 1516, the method 1500 determines if the neural networks for the processing modules and robots are validated successfully. For example, the method for validating the neural networks may be similar to the method described with reference to FIGS. 6-11. For example, the criteria for validation may be based on how accurately the neural networks' convergence characteristics are able to predict the program execution times and the robot transfer times. If the neural networks for the processing modules and robots are not validated successfully, the method 1500 returns to 1508 for further training.

At 1518, if the neural networks for the processing modules and robots are validated successfully, using the simulator, the method 1500 inputs into the scheduler level neural network the predicted times and the weights generated by the neural networks for optimizing throughput and wait time. At 1520, using the scheduler level neural network, the method 1500 predicts wafer routing and scheduling data, which includes when to schedule processing of the next set of wafers in the tool.

At 1524, the method for validating the scheduler level neural network may be similar to the method described with reference to FIGS. 6-11. For example, the criteria for validation may be based on how accurately the scheduler level neural network is able to predict the wafer routing and scheduling. If the scheduler level neural network is not validated successfully, the method 1500 returns to 1518 to further train the scheduler level neural network using the simulator.

At 1526, if the scheduler level neural network is validated successfully, the model comprising all of the neural networks for the processing modules, the robots, and the scheduler is integrated into the tool's controller (e.g., element 1616 shown in FIG. 16). The model can now predict the program execution times, robot transfer times, and wafer routing and scheduling on the tool.

At 1528, the model continues to incrementally train online (i.e., in situ, on the tool) using real production data from the tool. The automatically labeled data from the processing of a current set of wafers is used in addition to or instead of the corresponding data from the processing of a previous set of wafers to incrementally and continually train the model on the tool.

FIG. 16 shows an example of a tool 1600 comprising a plurality of processing modules 1602. For example, the tool 1600 may comprise a lower deck and an upper deck. Each deck may comprise four processing modules 1602 so that the tool 1600 may comprise a total of eight processing modules 1602. Alternatively, each deck may comprise eight processing modules 1602 as shown (only one deck is shown) so that the tool 1600 may comprise a total of sixteen processing modules 1602. For example, the processing modules 1602 may include electroplating cells (e.g., see FIG. 17). Additionally each deck may also comprise a plurality of pre- and post-processing modules 1604. In addition to electroplating, the tool 1600 may perform spin rinsing, spin drying, wet etching, pre-wetting and pre-chemical treating, electroless deposition, reducing, annealing, photoresist stripping, surface pre-activation, and so on.

A plurality of substrates 1606 are fed into the tool 1600 through a front opening unified pod (FOUP) 1608. A front-end robot 1610 transports the substrates 1606 from the FOUP 1608 to a spindle 1612 and then to one of the pre-processing modules 1604.

After pre-processing, a backend robot 1614 transports the substrates 1606 from the pre-processing modules 1604 to one or more of the processing modules 1602 for electroplating. Thereafter, the backend robot 1614 transports the substrates 1606 to one of the post-processing modules 1604.

The tool 1600 further comprises a system controller 1616 that controls the front-end and backend robots 1610, 1614 and the processes performed in the processing modules 1602, 1604. The controller 1616 schedules and controls the processing of the substrates 1606 using the trained model 1402 and the dynamic scheduler pacing method described above.

Figure 17:
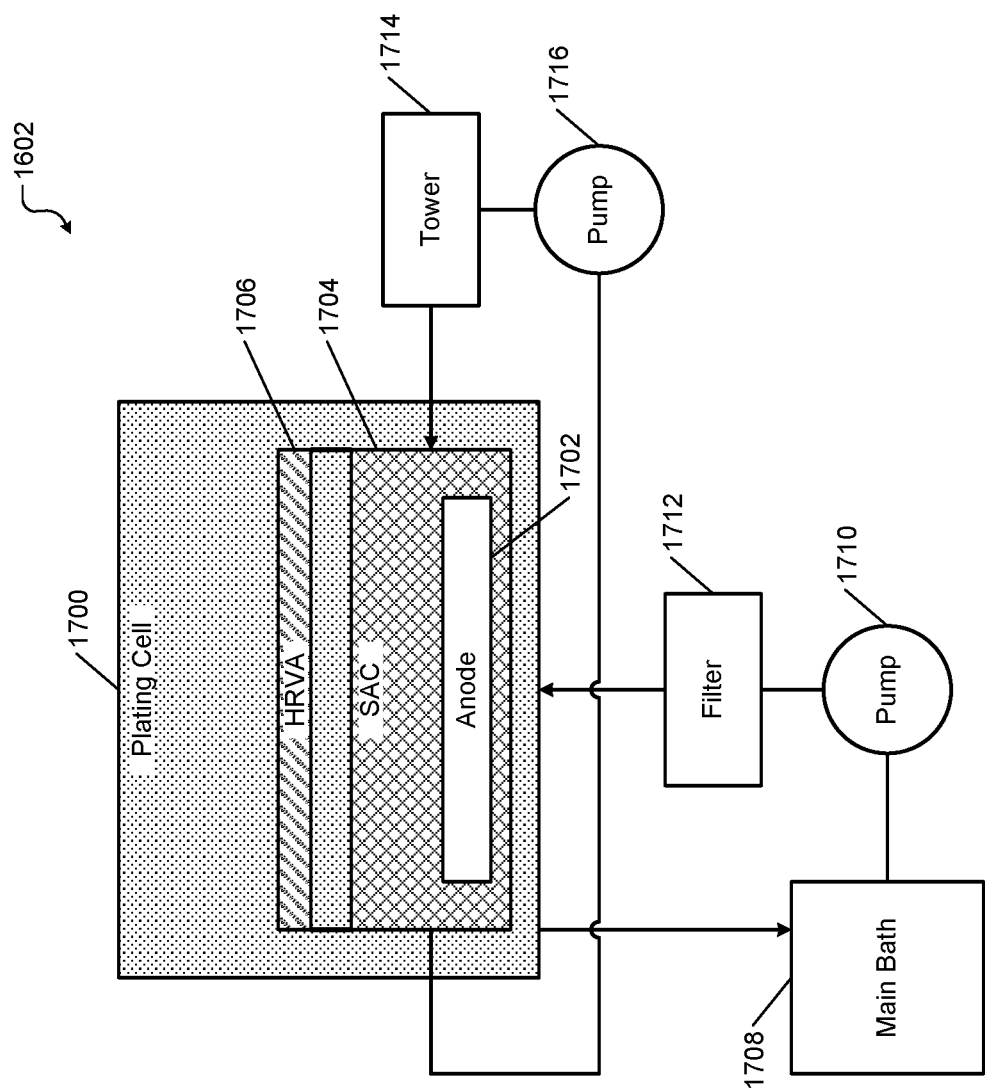
FIG. 17 shows an example of a processing module (e.g., an electroplating cell) used in the tool of FIG. 16.

FIG. 17 shows an example of the processing module 1602. For example, the processing module 1602 comprises an electroplating cell 1700. The electroplating cell 1700 comprises an anode 1702 in a separated anode chamber (SAC) 1704. The SAC 1704 is separated from the remainder of the electroplating cell 1700 by a membrane. The SAC 1704 includes a first liquid having a different chemistry than a second liquid in the remainder of the electroplating cell 1700.

The electroplating cell 1700 further comprises a high resistance virtual anode (HRVA) 1706 (mounting assembly not shown). During electroplating, the HRVA 1706 directs flow of the second liquid to parts of a wafer (not shown) when the wafer is lowered into the electroplating cell 1700 from the top of the electroplating cell 1700. A main bath (reservoir) 1708 supplies the second liquid into the electroplating cell 1700 via a pump 1710 and a filter 1712. A tower 1714 fills the SAC 1704 with the first liquid using a pump 1716. The processing module 1602 may comprise any other type of electroplating cell.

FIG. 18 shows an example of the fab data collection system 1800. For example, the system 1800 comprises a host computer 1802, data collector 1804, and a monitoring computer 1806 connected to a factory local area network (LAN) 1808 in a semiconductor manufacturing facility using one or more tools such as the tool 1600. The host computer 1802 communicates with one or more tools (e.g., the tool 1600). The host computer 1802 is used by an operator to issue commands, provide recipe and so on to the tool 1600.

The data collector 1804 receives various types of data from the tool 1600 without interfering with the communications of the host computer 1802 with the tool 1600. The monitoring computer 1806 is used for viewing and monitoring tool performance. The monitoring computer 1806 graphically shows tool settings and read back values of various tool parameters. The monitoring computer 1806 is used for troubleshooting issues with the tool 1600. The host computer 1802 communicates with the data collector 1804 and the monitoring computer 1806.

The system 1800 further comprises a server 1810 connected to the tool 1600 via an equipment LAN 1812. The server 1810 communicates with the host computer 1802 via the factory LAN 1808. The server 1810 collects data from the tool 1600 and supplies the data to the host computer 1802. One or more user interface (UI) computers 1814 are located on a side of the tool 1600 that is opposite to the loader side of the tool 1600. The loader side is class 100 clean while the UI computer side, where an operator operates the tool 1600, is class 1000 clean. The UI computers 1814 are connected to the equipment LAN 1812. A monitoring computer 1816 is connected to the tool 1600 via the equipment LAN 1812. The monitoring computer 1816 monitors the tool 1600 and communicates with the monitoring computer 1806 via the factory LAN 1808.

A system controller 1818 of the tool 1600 (e.g., the system controller 1616) controls the tool 1600. A plurality of module controllers 1820 control the individual processing modules 1602, 1604. A plurality of input/output (I/O) controllers 1822 control individual operations of the processing modules 1602, 1604. The system controller 1818 also communicates with one or more of the I/O controllers 1822 (e.g., to control the robots 1610, 1614; and to control features other than the processing modules 1602, 1604 of the tool). Various switches 1824 are used to access appropriate I/O controllers 1818.

The functionalities and operations described above with reference to FIGS. 14-17 may be performed by the system controller 1818, the monitoring computer 1816, or both. Additionally or alternatively, other computing devices described with reference to FIG. 18 may also perform at least some of the functionalities and operations described above with reference to FIGS. 14-17.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another are within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

For example, the controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for processing semiconductor substrates in a tool comprising a plurality of processing chambers configured to process the semiconductor substrates according to a recipe, the system comprising:
   a processor; and
   non-transitory memory storing instructions for execution by the processor, wherein the instructions are configured to:
      receive first data from the tool regarding processing of the semiconductor substrates in the plurality of processing chambers according to the recipe;
      receive second data regarding a configuration of the tool and the recipe;
      simulate, using the second data, a plurality of processing scenarios and scheduling parameters for the plurality of processing scenarios for processing the semiconductor substrates in the plurality of processing chambers according to the recipe;
      simulate the processing of the semiconductor substrates in the plurality of processing chambers according to the recipe using the plurality of processing scenarios and the scheduling parameters for the plurality of processing scenarios;
      train a model using the first data and data generated by the simulation to predict optimum scheduling parameters for processing the semiconductor substrates in the plurality of processing chambers according to the recipe;
      receive inputs from the tool regarding processing of one of the semiconductor substrates in the plurality of processing chambers according to the recipe;
      predict based on the inputs, using the model, optimum scheduling parameters for processing the one of the semiconductor substrates in the plurality of processing chambers according to the recipe; and
      schedule operations of the tool based on the optimum scheduling parameters for processing the one of the semiconductor substrates in the plurality of processing chambers according to the recipe.

2. The system of claim 1 wherein the instructions are configured to execute the operations of the tool based on the optimum scheduling parameters for processing the one of the semiconductor substrates in the plurality of processing chambers according to the recipe.

3. The system of claim 1 wherein the optimum scheduling parameters minimize idle times for the one of the semiconductor substrates during processing in the plurality of processing chambers according to the recipe and wherein the optimum scheduling parameters maximize throughput of the tool.

4. The system of claim 1 wherein the instructions are configured to train the model using a machine learning method including an artificial neural network and support vector regression.

5. The system of claim 1 wherein the instructions are configured to:
   analyze the first data received from the tool and the data generated by the simulation;
   detect, based on the analysis, patterns regarding preventive maintenance operations, wafer-less auto clean times, wait times, recipe times, and throughput for the tool; and
   train the model based on the detected patterns.

6. The system of claim 1 wherein the instructions are configured to train the model to predict the optimum scheduling parameters for one of the plurality of processing scenarios.

7. The system of claim 1 wherein the instructions are configured to (Original) train the model to predict the optimum scheduling parameters for all of the plurality of processing scenarios.

8. The system of claim 1 wherein the instructions are configured to train the model for performing only etching operations on the one of the semiconductor substrates.

9. The system of claim 1 wherein the instructions are configured to train the model for performing both etching and stripping operations on the one of the semiconductor substrates.

10. The system of claim 1 wherein the model is implemented remotely from the tool and wherein the instructions are configured to train the model based on data received from multiple tools.

11. The system of claim 1 wherein the instructions are configured to adjust the model for tool-to-tool variations in configurations and operations.

12. The system of claim 1 wherein the model is implemented in a cloud as software-as-a-Service (SaaS) and wherein the tool is configured to access the model via a network.

13. The system of claim 1 wherein:
   the instructions are configured to train a second model based on data of a second tool;
   the model and the second model are implemented remotely from the tool and the second tool; and wherein the tool and the second tool are respectively configured to access the model and the second model via one or more networks.

14. The system of claim 13 wherein the instructions are configured to allow the tool and the second tool to respectively select the model and the second model based on configurations of the tool and the second tool.

15. The system of claim 1 wherein the model is implemented on the tool and wherein the instructions are configured to predict, using the model, the optimum scheduling parameters for processing the one of the semiconductor substrates in the plurality of processing chambers according to the recipe using data generated by the tool.

16. The system of claim 1 wherein the model is implemented on the tool and wherein the instructions are configured to adjust the model for any drift in performance of the tool.

17. The system of claim 1 wherein the first data received from the tool includes data from preventive maintenance operations performed on the tool and data regarding recipe times and wafer-less auto clean times for the tool.

18. The system of claim 1 wherein the data generated by the simulation includes data generated based on the configuration of the tool, wafer-flow types, run scenarios, recipe times, and wafer-less auto clean times obtained from the tool.

19. The system of claim 1 wherein the inputs received from the tool include data regarding a number of preventive maintenance operations, recipe times, and wafer-less auto clean times for the tool.

20. The system of claim 1 wherein the instructions are configured to predict the optimum scheduling parameters by factoring in one or more skipped preventive maintenance operations.

21. The system of claim 1 wherein the instructions are configured to:
  schedule, using the model, a plurality of operations for processing the one of the semiconductor substrates in the plurality of processing chambers according to the recipe, wherein the tool progresses through a plurality of states in response to performing the plurality of operations, respectively, and wherein a state of the tool includes indications of resources of the tool and a processing status of the one of the semiconductor substrate;
  for each of the plurality of states, send to the model a current state of the plurality of states and multiple schedulable operations to progress to a next state of the plurality of states, receive from the model a best operation from the multiple schedulable operations selected by the model based on the current state to progress to the next state, and simulate execution of the best operation to simulate progression to the next state; and
  train the model to recommend the best operations as the plurality of operations in response to the tool progressing through the plurality of states when processing the semiconductor substrates in the plurality of processing chambers according to the recipe.

22. A system for processing semiconductor substrates in a tool comprising a plurality of processing chambers configured to process the semiconductor substrates according to a recipe, the system comprising:
  a processor; and
  non-transitory memory storing instructions for execution by the processor, wherein the instructions are configured to:
    schedule, using a model, a plurality of operations for processing a semiconductor substrate in the plurality of processing chambers according to the recipe, wherein the tool progresses through a plurality of states in response to performing the plurality of operations, respectively, and wherein a state of the tool includes indications of resources of the tool and a processing status of the semiconductor substrate;
    for each of the plurality of states, send to the model a current state of the plurality of states and multiple schedulable operations to progress to a next state of the plurality of states, receive from the model a best operation from the multiple schedulable operations selected by the model based on the current state to progress to the next state, and simulate execution of the best operation to simulate progression to the next state; and
    train the model to recommend the best operations as the plurality of operations in response to the tool progressing through the plurality of states when processing the semiconductor substrate in the plurality of processing chambers according to the recipe.

23. The system of claim 22 wherein the instructions are configured to:
  train the model, using historical data regarding processing of the semiconductor substrates received from the tool and by simulating a plurality of processing scenarios for the tool, to predict optimum scheduling parameters for processing the semiconductor substrate in the plurality of processing chambers according to the recipe;
  receive inputs from the tool regarding processing of the semiconductor substrate in the plurality of processing chambers according to the recipe;
  predict based on the inputs, using the model, optimum scheduling parameters for processing the semiconductor substrate in the plurality of processing chambers according to the recipe; and
  schedule, based on the optimum scheduling parameters, the plurality of operations for processing the semiconductor substrate in the plurality of processing chambers according to the recipe.

24. The system of claim 23 wherein the instructions are configured to execute the plurality of operations based on the optimum scheduling parameters for processing the semiconductor substrate in the plurality of processing chambers according to the recipe.

25. The system of claim 23 wherein the optimum scheduling parameters minimize idle times for the semiconductor substrate during processing in the plurality of processing chambers according to the recipe and wherein the optimum scheduling parameters maximize throughput of the tool.

26. The system of claim 23 wherein the instructions are configured to train the model using a machine learning method including an artificial neural network and support vector regression.

27. The system of claim 23 wherein the instructions are configured to:
  analyze the historical data received from the tool and data generated by simulating the plurality of processing scenarios for the tool;
  detect, based on the analysis, patterns regarding preventive maintenance operations, wafer-less auto clean times, wait times, recipe times, and throughput for the tool; and
  train the model based on the detected patterns.

28. The system of claim 23 wherein the instructions are configured to train the model to predict the optimum scheduling parameters for one of the plurality of processing scenarios.

29. The system of claim 23 wherein the instructions are configured to train the model to predict the optimum scheduling parameters for all of the plurality of processing scenarios.

30. The system of claim 23 wherein the instructions are configured to train the model for performing only etching operations on the semiconductor substrates.

31. The system of claim 23 wherein the instructions are configured to train the model for performing both etching and stripping operations on the one of the semiconductor substrates.

32. The system of claim 23 wherein the model is implemented remotely from the tool and wherein the instructions are configured to train the model based on data received from multiple tools.

33. The system of claim 32 wherein the instructions are configured to adjust the model for tool-to-tool variations in configurations and operations.

34. The system of claim 23 wherein the model is implemented in a cloud as software-as-a-Service (SaaS) and wherein the tool is configured to access the model via a network.

35. The system of claim 23 wherein the model is implemented on the tool and wherein the instructions are configured to predict, using the model, the optimum scheduling parameters for processing the semiconductor substrate in the plurality of processing chambers according to the recipe using data generated by the tool.

36. The system of claim 23 wherein the model is implemented on the tool and wherein the instructions are configured to adjust the model for any drift in performance of the tool.

37. The system of claim 23 wherein the data received from the tool includes data from preventive maintenance operations performed on the tool and data regarding recipe times and wafer-less auto clean times for the tool.

38. The system of claim 23 wherein the data generated by simulating the plurality of processing scenarios includes data generated based on a configuration of the tool, waferflow types, run scenarios, recipe times, and wafer-less auto clean times obtained from the tool.

39. The system of claim 23 wherein the inputs received from the tool include data regarding a number of preventive maintenance operations, recipe times, and wafer-less auto clean times for the tool.

40. The system of claim 23 wherein the instructions are configured to predict the optimum scheduling parameters by factoring in one or more skipped preventive maintenance operations.

41. A tool for processing semiconductor substrates comprising:
a first robot configured to input the semiconductor substrates into the tool for processing the semiconductor substrates in the tool;
a plurality of processing chambers configured to process the semiconductor substrates in the tool according to a recipe;
a second robot configured to transfer the semiconductor substrates between the plurality of processing chambers according to the recipe; and
a controller configured to predict, using a model trained by simulating the tool and the recipe:
processing times for processing the semiconductor substrates in the plurality of processing chambers;
transfer times for the second robot for transferring the semiconductor substrates between the plurality of processing chambers;
a route to transfer the semiconductor substrates between the plurality of processing chambers based on the processing times and the transfer times; and
a time when the first robot is to schedule additional semiconductor substrates for processing in the tool based on the processing times and the transfer times,
wherein processing the semiconductor substrates according to the predicted route and processing the additional semiconductor substrates according to the predicted time optimizes wait times for the semiconductor substrates along the predicted route and optimizes throughput of the tool.

42. The tool of claim 41 wherein the controller is configured to further train the model incrementally based on data generated during the processing of the semiconductor substrates and the additional semiconductor substrates in the tool.

43. The tool of claim 42 wherein the controller is configured to predict, using the further trained model:
second processing times, second transfer times, and a second route for processing the additional semiconductor substrates in the tool; and
a second time to schedule a next set of semiconductor substrates for processing in the tool,
wherein processing the additional semiconductor substrates according to the second route and processing the next set of semiconductor substrates according to the second time further optimizes wait times for the additional semiconductor substrates and the throughput of the tool.

44. The tool of claim 41 wherein the controller is configured to adjust the model in response to any changes to the recipe, the tool, or both.

45. The tool of claim 41 wherein the model comprises:
a first plurality of neural networks configured to predict the processing times for the plurality of processing chambers, respectively;
a second plurality of neural networks configured to predict the transfer times for the first and second robots, respectively; and
a third neural network coupled to the first and second plurality of neural networks and configured to predict the route to transfer the semiconductor substrates between the plurality of processing chambers and to predict the time when the first robot is to schedule the additional semiconductor substrates for processing in the tool.

46. The tool of claim 41 wherein the model is further trained by simulating configurations of a plurality of tools and a plurality of recipes.

47. The tool of claim 46 wherein the further trained model is configured to output a recommendation for a tool configuration in response to receiving recipe information as input.

48. The tool of claim 41 wherein the recipe is for depositing a plurality of layers on the semiconductor substrates and wherein:
the plurality of processing chambers includes one or more processing chambers for depositing the plurality of layers, and a preprocessing chamber and a post-processing chamber for respectively processing the semiconductor substrates before and after depositing the plurality of layers;

the second robot is configured to transfer the semiconductor substrates between the plurality of processing chambers according to the predicted route to optimize the wait times for the semiconductor substrates; and the first robot is configured to schedule the additional semiconductor substrates for processing in the tool according to the predicted time to optimize the throughput of the tool.

49. A system for optimizing throughput and wait times during processing semiconductor substrates in a semiconductor processing tool, the system comprising:

a processor; and non-transitory memory storing instructions for execution by the processor, wherein the instructions are configured to:

simulate, based on a configuration of the semiconductor processing tool and a recipe to be performed on the semiconductor substrates in the semiconductor processing tool, a plurality of routes for routing the semiconductor substrates between a plurality of processing chambers of the semiconductor processing tool;

simulate processing of the semiconductor substrates in the semiconductor processing tool according to the recipe along the plurality of routes;

simulate, based on the processing of the semiconductor substrates, a plurality of timing schedules for subsequently processing additional semiconductor substrates in the semiconductor processing tool;

simulate processing of the additional semiconductor substrates according to the plurality of timing schedules;

train a model based on data generated by the simulations;

predict, using the model on the semiconductor processing tool, an optimum route to transfer the semiconductor substrates between the plurality of processing chambers when processing the semiconductor substrates in the semiconductor processing tool according to the recipe;

predict, using the model on the semiconductor processing tool, an optimum time to schedule the additional semiconductor substrates for processing in the semiconductor processing tool;

process, in the semiconductor processing tool, the semiconductor substrates according to the optimum route to optimize wait times for the semiconductor substrates along the optimum route; and process, in the semiconductor processing tool, the additional semiconductor substrates at the optimum time to optimize throughput of the semiconductor processing tool.

50. The system of claim 49 wherein the instructions are configured to train the model based on the data generated by the simulations to predict:

processing times for processing the semiconductor substrates in the plurality of processing chambers;

transfer times for a robot of the semiconductor processing tool for transferring the semiconductor substrates between the plurality of processing chambers;

the optimum route for routing the semiconductor substrates between the plurality of processing chambers based on the processing times and the transfer times; and the optimum time to schedule the additional semiconductor substrates for processing in the semiconductor processing tool based on the processing times and the transfer times.

51. The system of claim 49 wherein the instructions are configured to further train the model incrementally based on data generated during the processing of the semiconductor substrates and the additional semiconductor substrates in the semiconductor processing tool.

52. The system of claim 49 wherein the instructions are configured to adjust the model for any changes to the recipe, the semiconductor processing tool, or both.

53. The system of claim 49 wherein the instructions are configured to generate the model based on the data generated by the simulations, the model comprising:

a first plurality of neural networks configured to predict processing times for processing the semiconductor substrates in the plurality of processing chambers, respectively;

a second plurality of neural networks configured to predict transfer times for first and second robots, respectively, wherein the first and second robots are respectively configured to transfer the semiconductor substrates into the semiconductor processing tool and between the plurality of processing chambers; and a third neural network coupled to the first and second plurality of neural networks and configured to predict the optimum route for routing the semiconductor substrates between the plurality of processing chambers and to predict the optimum time to schedule the additional semiconductor substrates for processing in the semiconductor processing tool.

54. The system of claim 49 wherein the instructions are configured to train the model by simulating configurations of a plurality of semiconductor processing tools and a plurality of recipes.

55. The system of claim 54 wherein the instructions are configured to train the model to output a recommendation for a tool configuration in response to receiving recipe information as input.

* * * * *